(12) United States Patent
Adams

(10) Patent No.: US 7,409,601 B2
(45) Date of Patent: *Aug. 5, 2008

(54) READ-WRITE FUNCTION SEPARATION APPARATUS AND METHOD

(75) Inventor: Phillip M. Adams, Salt Lake City, UT (US)

(73) Assignee: Phillip M. Adams & Associates, L.L.C., Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/472,661

(22) Filed: Jun. 22, 2006

(65) Prior Publication Data

US 2006/0242469 A1    Oct. 26, 2006

Related U.S. Application Data

(63) Continuation of application No. 10/715,132, filed on Nov. 17, 2003, now Pat. No. 7,069,475, which is a continuation of application No. 09/571,969, filed on May 16, 2000, now Pat. No. 6,687,858.

(51) Int. Cl.
    *G06F 11/00* (2006.01)
(52) U.S. Cl. .......................................... 714/42; 714/47
(58) Field of Classification Search ................ 714/5, 714/42, 47, 100, 44, 54, 56
    See application file for complete search history.

(56) References Cited

U.S. PATENT DOCUMENTS

| | | | |
|---|---|---|---|
| 3,908,099 A | 9/1975 | Borbas et al. | |
| 4,459,661 A | 7/1984 | Kaneda et al. | |
| 4,589,063 A | 5/1986 | Shah et al. | |
| 4,654,783 A | 3/1987 | Veres et al. | |
| 4,727,480 A | 2/1988 | Albright et al. | |
| 4,779,187 A | 10/1988 | Letwin | |
| 4,888,680 A | 12/1989 | Sander et al. | |
| 4,942,606 A | 7/1990 | Kaiser et al. | |
| 4,996,690 A | 2/1991 | George et al. | |
| 5,062,042 A * | 10/1991 | Binkley et al. | ............. 707/205 |
| 5,093,910 A | 3/1992 | Tulpule et al. | |
| 5,105,427 A | 4/1992 | Ando | |

(Continued)

OTHER PUBLICATIONS

NEC Electronics, Inc., "IBM-NEC Meeting for μPD765A/μPD72065 Problem" (U.S.A., May 1987).

(Continued)

*Primary Examiner*—Van H Nguyen
(74) *Attorney, Agent, or Firm*—Pate Pierce & Baird

(57) ABSTRACT

A system and method for a software override capability for enforcing a predetermined state for an otherwise hardware-programmable device. Software that may think it knows what it is doing may try to control a hardware device, but may not know about a hardware issue, such as another feature or defect requiring that the device stay in a certain state. The technique programmatically maintains a persistent hardware state independent of any other control software. To other software, the software layer of the invention is indistinguishable and inseparable from hardware. Nothing can slip in between. Any insertion attempt will be detected and disallowed. Features of the processor or system chips actually weld the software to the hardware, which feature disallows any software intervention between the welded software layer and the hardware.

16 Claims, 15 Drawing Sheets

U.S. PATENT DOCUMENTS

| | | |
|---|---|---|
| 5,212,795 A | 5/1993 | Hendry |
| 5,233,692 A | 8/1993 | Gajjar et al. |
| 5,237,567 A | 8/1993 | Nay et al. |
| 5,379,414 A | 1/1995 | Adams |
| 5,416,782 A | 5/1995 | Wells et al. |
| 5,422,892 A | 6/1995 | Hii et al. |
| 5,619,642 A | 4/1997 | Nielson et al. |
| 5,983,002 A | 11/1999 | Adams |
| 6,061,411 A | 5/2000 | Wooten |
| 6,195,767 B1 * | 2/2001 | Adams ........................ 714/47 |
| 6,405,322 B1 * | 6/2002 | Gaither et al. ................. 714/5 |
| 6,687,858 B1 | 2/2004 | Adams |
| 6,728,060 B1 * | 4/2004 | Chng et al. .............. 360/77.01 |

OTHER PUBLICATIONS

Intel Corporation, Letter to customers from Jim Sleezer, Product Manager, with attachments, regarding FDC error and possible solutions (U.S.A., May 2, 1988).

Adams, P.M., Nova University, Department of Computer Science, "Hardware-Induced Data Virus," Technical Report TR-881101-1 (U.S.A., Nov. 14, 1988).

Advanced Military Computing, "Hardware Virus Threatens Databases," vol. 4, No. 25, pp. 1 & 8 (U.S.A., Dec. 5, 1988).

Intel Corporation, "8237A/8237A-4/8237A-5 High Performance Programmable DMA Controller" (U.S.A., date unknown) pp. 2-52 to 2-67.

Intel Corporation, "8272A Single/Double Density Floppy Disk Controller" (U.S.A., date unknown) pp. 6-478 to 6-491.

* cited by examiner

READ-WRITE FUNCTION SEPARATION APPARATUS AND METHOD

RELATED APPLICATIONS

This application is a continuation of U.S. patent application Ser. No. 10/715,132 filed Nov. 17, 2003 and entitled SOFTWARE-HARDWARE WELDING SYSTEM, which will issue as U.S. Pat. No. 7,069,475 on Jun. 27, 2006, which is a continuation of U.S. patent application Ser. No. 09/571,969 filed May 16, 2000 and entitled SOFTWARE-HARDWARE WELDING SYSTEM, which issued as US. Pat. No. 6,687,858 on Feb. 3, 2004.

BACKGROUND

1. The Field of the Invention

This invention relates to software programming for controlling behavior of hardware devices, and, more particularly, to novel systems and methods for inseparably welding a software layer to a hardware device interface, thus precluding insertion of any other software layer therebetween.

2. Background of the Invention

Computers are now used to perform functions and maintain data critical to many organizations. Businesses use computers to maintain essential financial and other business data. Computers are also used by government to monitor, regulate, and even activate, national defense systems. Maintaining the integrity of the stored data is essential to the proper functioning of these computer systems, and data corruption can have serious (even life threatening) consequences.

Most computer systems include media drives, such as floppy diskette drives for storing and retrieving data. For example, an employee of a large financial institution may have a personal computer that is attached to the main system. In order to avoid processing delays on the mainframe, the employee may routinely transfer data files from a host system to a local personal computer and then back again, temporarily storing or backing up data on a local floppy diskette or other media. Similarly, an employee with a personal computer at home may occasionally decide to take work home, transporting data away from and back to the office on a floppy diskette.

Data transfer to and from media, such as a floppy diskette, is controlled by a device called a Floppy Diskette Controller ("FDC"). The FDC is responsible for interfacing the computer's Central Processing Unit ("CPU") with a physical media drive. Significantly, since the drive is spinning, it is necessary for the FDC to provide data to the drive at a specified data rate. Otherwise, the data will be written to a wrong location on the media.

The design of an FDC accounts for situations occurring when a data rate is not adequate to support rotating media. Whenever this situation occurs, the FDC aborts the write operation and signals to the CPU that a data under run condition has occurred.

Unfortunately, however, it has been found that a design flaw in many FDCs makes impossible the detection of certain data under run conditions. This flaw has, for example, been found in the NEC 765, INTEL 8272 and compatible Floppy Diskette Controllers. Specifically, data loss and/or data corruption may routinely occur during data transfers to or from diskettes (or tape drives and other media attached via the FDC), whenever the last data byte of a sector being transferred is delayed for more than a few microseconds. Furthermore, if the last byte of a sector write operation is delayed too long then the next (physically adjacent) sector of the media will be destroyed as well.

For example, it has been found that these faulty FDCs cannot detect a data under run on the last byte of a diskette read or write operation. Consequently, if the FDC is preempted or otherwise suspended during a data transfer to a diskette (thereby delaying the transfer), and an under run occurs on the last byte of a sector, the following occur: (1) the under run flag does not get set, (2) the last byte written to the diskette is made equal to either the previous byte written or zero, and (3) a successful Cyclic Redundancy Check ("CRC") is generated on the improperly altered data. The result is that incorrect data is written to the diskette and validated by the FDC. Herein, references to a floppy diskette may be read as "any media" and a floppy diskette drive is but a specific example of a media drive controllable by an FDC.

Conditions under which this problem may occur have been identified in connection with the instant invention by identifying conditions that can delay data transfer to or from the diskette drive. In general, this requires that the computer system be engaged in "multi-tasking" operation or in overlapped input/output ("I/O") operation. Multi-tasking is the ability of a computer operating system to simulate the concurrent execution of multiple tasks.

Importantly, concurrent execution is only "simulated" because only one CPU exists in a typical personal computer. One CPU can only process one task at a time. Therefore, a system interrupt is used to rapidly switch between the multiple tasks, giving the overall appearance of concurrent execution.

MS-DOS and PC-DOS, for example, are single-task operating systems. Therefore, one could argue that the problem described above would not occur. However, a number of standard MS-DOS and PC-DOS operating environments simulate multi-tasking and are susceptible to the problem.

In connection with the instant invention, for example, the following environments have been found to be prime candidates for data loss and/or data corruption due to defective FDCs: local area networks, 327x host connections, high density diskettes, control print screen operations, terminate and stay resident ("TSR") programs. The problem also occurs as a result of virtually any interrupt service routine. Thus, unless MS-DOS and PC-DOS operating systems disable all interrupts during diskette transfers, they are also highly susceptible to data loss and/or corruption.

The UNIX operating system is a multi-tasking operating system. It has been found, in connection with the instant invention, how to create a situation that can cause the problem within UNIX. One example is to begin a large transfer to the diskette and place that transfer task in the background. After the transfer has begun then begin to process the contents of a very large file in a way that requires the use a Direct Memory Access ("DMA") channel of a higher-priority than that of the floppy diskette controller's DMA channel. These might include, for example, video updates, multi-media activity, etc. Video access forces the video buffer memory refresh logic on DMA channel 1, along with the video memory access, which preempts the FDC operations from occurring on DMA channel 2 (which is lower priority than DMA channel 1).

This type of example creates an overlapped I/O environment and can force the FDC into an undetectable error condition. More rigorous examples include a concurrent transfer of data to or from a network or tape drive using a high priority DMA channel while the diskette transfer is active. Clearly, the number of possible error producing examples is infinite, yet each is highly probable in this environment.

For all practical purposes the OS/2 and newer WINDOWS operating systems can be regarded as UNIX derivatives. They suffer from the same problems that UNIX does. Two significant differences exist between these operating systems and UNIX.

First, they both semaphore video updates with diskette operations tending to avoid forcing the FDC problem to occur. However, any direct access to the video buffer, in either real or protected mode, during a diskette transfer will bypass this feature and result in the same faulty condition as UNIX.

Second, OS/2 incorporates a unique command that tends to avoid the FDC problem by reading back every sector that is written to the floppy diskette in order to verify that the operation completed successfully. This command is an extension to the MODE command (MODE DSKT VER=ON). With these changes, data loss and/or data corruption should occur less frequently than otherwise. However, the FDC problem may still destroy data that is not related to the current sector operation.

A host of other operating systems are susceptible to the FDG problem just as DOS, WINDOWS, WINDOWS 95, WINDOWS 98, WINDOWS NT, OS/2, and UNIX. However, these systems may not have an installed base as large as DOS, Windows, OS/2 or UNIX, and may, therefore, receive less motivation to address the problem. Significantly, as long as the operating systems utilize the FDC and service system interrupts, the problem can manifest itself. This can occur in computer systems that use virtually any operating system.

Some in the computer industry have suggested that data corruption by the FDC is extremely rare and difficult to reproduce. This is similar to the argument presented dining the highly publicized 1994 defective INTEL PENTIUM scenario. Error rate frequencies for the defective PENTIUM ranged from microseconds to tens-of-thousands of years! The FDC problem is often very difficult to detect during normal operation because of its random characteristics. The only way to visibly detect this problem is to have the FDC corrupt data that is critical to the operation at hand. However, many locations on the diskette may be corrupted, yet not accessed. In connection with the instant invention, the FDC problem has been routinely reproduced and may be more common than heretofore believed.

Computer users may, in fact, experience this problem frequently and not even know about it. After formatting a diskette, for example, the system may inform the user that the diskette is bad, although the user finds that if the operation is performed again on the same diskette everything is fine. Similarly, a copied file may be unusable, and the computer user concludes that he or she just did something wrong. For many in this high-tech world, it is very difficult to believe that the machine is in error and not themselves. It remains typical, however, that full diskette back-ups are seldom restored, that all instructions in programs are seldom, if ever, executed, that diskette files seldom utilize all of the allocated space, and that less complex systems are less likely to exhibit the problem.

Additionally, the first of these faulty FDCs was shipped in the late 1970's. The devices were primarily used at that time in special-purpose operations in which the FDC problem would not normally be manifest. Today, on the other hand, the FDCs are incorporated into general-purpose computer systems that are capable of concurrent operation (multi-tasking or overlapped I/O). Thus, it is within today's environments that the problem is most likely to occur by having another operation delay a data transfer to a diskette. The more complex a computer system, the more likely it is that one activity will delay another, thereby creating an FDC error condition.

In short, the potential for data loss and/or data corruption is present in all computer systems that utilize the defective version of this type of FDC, presently estimated at about 50 million personal computers. The design flaw in the FDC causes data corruption to occur and manifest itself in the same manner as a destructive computer virus. Furthermore, because of its nature, this problem has the potential of rendering even secure databases absolutely useless.

Moreover, more recent FDC devices may be affected by the use of first-in-first-out (FIFO) devices that alter the usual operation. Whenever the FIFO is enabled, detection of the defective controller may be well nigh impossible. Nevertheless, when the FIFO is not enabled, due to the vagaries of some particular operating system or device driver, the defect may appear and cause data corruption.

Various conventional ways of addressing the FDC problem, such as a hardware recall, have significant associated costs, risks and/or disadvantages. In addition to a solution to the FDC problem, an apparatus and method are needed to accurately, rapidly, reliably, and correctly, identify any defective FDC. The identification of defective FDCs is the first step in attempting to solve the problem of defective FDCs. A solution method and apparatus for repairing a defective FDC are disclosed in U.S. Pat. No. 5,379,414 incorporated herein by reference.

BRIEF SUMMARY AND OBJECTS OF THE INVENTION

In view of the foregoing, it is a primary object of the present invention to provide a method and apparatus for detecting defective Floppy Diskette Controllers ("FDCs").

It is another object of the present invention to provide a software (programmatic) solution that may be implemented in a general purpose digital computer, which eliminates the need for visual inspection and identification of the defective FDCs as well as the need for any hardware recall and replacement.

Consistent with the foregoing objects, and in accordance with the invention as embodied and broadly described herein, an apparatus and method are disclosed in one embodiment of the present invention as including data structures, executable modules, and hardware, implementing a detection method capable of immediately, repeatedly, correctly, and accurately detecting defective FDCs.

The apparatus and method may rely on 1) determining whether or not the FDC under test is a new model FDC (potentially non-defective), and 2) if the FDC under test is not a new model FDC, installing an interposer routine to force the FDC to delay a transfer of a last data byte of a sector either to or from the floppy diskette whose controller is tested. A test condition is thus created in the hardware to cause defective FDCs to corrupt the last data byte of the sector. A second portion of an apparatus and method may confirm a diagnosis. Thus the apparatus and method may ensure that old-model non-defective FDCs are not wrongly identified as defective.

Chips manufactured in recent years may have the data corrupting defect originally identified. Nevertheless, the defect may manifest itself in other ways. Meanwhile, the three needs remain. The failure of the chip needs to be detected, including navigation of the masking features that may limit an ability to detect FIFO-enabled chips. Second, correction of the defect in hardware, by using a software solution is needed. Finally, detection of corruption resulting from previous failures of a FIFO-enabled chip to detect errors will be required.

A system and method in accordance with the invention may be implemented to provide a software override capability for enforcing a predetermined state for an otherwise hardware-programmable device. Software that may think it knows what it is doing may try to control a hardware device, but may not know about a hardware issue, such as another process or a defect requiring that the device remain in a certain state.

The technique programmatically maintains a persistent hardware state independent of any other control software. To other software, the software layer of the invention is indistinguishable and inseparable from hardware. Nothing can slip in between. Anything insertion attempt will be detected and disallowed. Features of the processor or system chips actually weld the software to the hardware, which disallows any software intervention between the welded software layer and the hardware.

Various uses for this method may include making hardware persistently behave in a given fashion, in spite of ongoing requests from other software to reconfigure the underlying hardware behavior. This may provide a software-only solution to a hardware defect. One may extend hardware capability without replacing hardware, and without concern for insertion of other software layers that would program performance impermissibly if allowed to obtain conventional access, such as I/O port commands, memory-mapped I/O commands. Monitoring capability of access and control of an underlying hardware interface is also available.

One application of a method in accordance with the invention may provide a complete software implementation of overriding a detection process that is capable of detecting defective Floppy Diskette Controllers ("FDCs") without visual hardware inspection or identification. The approach taken includes a multi-phase strategy incorporating programmatic FDC identification, software DMA shadowing, defect inducement, and use of a software decoding network, all of which allows the implementation of the invention to adjust to a wide range of computer system performance levels.

A method and apparatus for detecting and preventing floppy diskette controller data transfer errors in computer systems is also provided. The approach taken may involve software DMA shadowing and the use of a software decoding network.

In certain embodiments, an apparatus for detecting a defective floppy diskette controller may comprise a computer readable medium storing executable and operational data structures. The data structures may include a determination module for identifying a hardware resource associated with a computer system, a welding module for inseparably connecting a persistent software layer to the hardware resource, and a defense module for resisting attempts by other software to unweld the persistent software layer from the hardware resource.

The apparatus may store data structures including a function module for performing a desired function whenever the hardware resource is accessed by the computer system. The function module may be configured to control the hardware resource to provide a function otherwise unavailable from the hardware resource as manufactured. The data structures may include an unweld module for disconnecting the persistent software layer from the hardware resource. The unweld module may be configured to be embedded in the welding module.

In at least one embodiment, a computer readable medium storing data structures may embody steps for effecting a method providing a computer system comprising a processor operably connected to a first hardware resource. It may include installing a driver corresponding to the first hardware resource, and including a resource identifier for identifying available hardware resources. Further the method may include identification of the processor, by the resource identifier, the first hardware resource and executing, on the processor, a welder to inseparably connect a persistent software layer.

The method may include accessing, by the processor, a first hardware interface and automatically engaging the persistent software layer upon accessing, by the processor, to the hardware interface. The method may provide a defense module for responding to attempts to unweld the persistent software layer from the first hardware interface, and provide a controller for controlling the first hardware resource.

The persistent software layer may have a function module, executable to perform an extension function, the extension function being beyond the inherent functionality of the controller. The extension function may have a function lock for overriding requests from other software to reconfigure the functionality of the first hardware resource. The function module may be configured to perform a function selected from detection and correction of a hardware defect in the controller.

The function module may be configured to extend the functional capability of at least one of the first hardware resource and the controller, without replacement thereof. The function module may be configured to monitor at least one of access and control of at least one of the first hardware device and the controller.

In one embodiment, a method for welding a software layer to a hardware layer in a computer system having hardware interfaces may include providing a computer system comprising a processor operably connected to a first hardware resource., with a first hardware interface corresponding to the first hardware resource. Then, the method may install a driver corresponding to the first hardware resource, and including a resource identifier for identifying available hardware resources. After identifying the first hardware resource, the method may execute on the processor a welder for inseparably connecting a persistent software layer.

The method may include accessing, by the processor, the first hardware interface; and automatically engaging the persistent software layer upon accessing, by the processor, the hardware interface. The persistent software layer may have included a function module configured to monitor at least one of access and control of at least one of the first hardware device and the controller. Inseparably connecting may result in rendering the connection unbreakable by other than the welder. Typically it will render substantially impossible an insertion of an executable between the first hardware resource and the persistent software layer.

BRIEF DESCRIPTION OF THE DRAWINGS

The foregoing and other objects and features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings, in which:

DETAILED DESCRIPTION OF THE PREFERRED EMBODIMENTS

It will be readily understood that the components of the present invention, as generally described and illustrated in the Figures herein, could be arranged and designed in a wide variety of different configurations. Thus, the following more detailed description of the embodiments of the system apparatus and method of the present invention, as represented in FIGS. 1 through 15, is not intended to limit the scope of the invention, as claimed, but it is merely representative of the presently preferred embodiments of the invention.

The presently preferred embodiments of the invention will be best understood by reference to the drawings, wherein like parts are designated by like numerals throughout.

Figure 1:
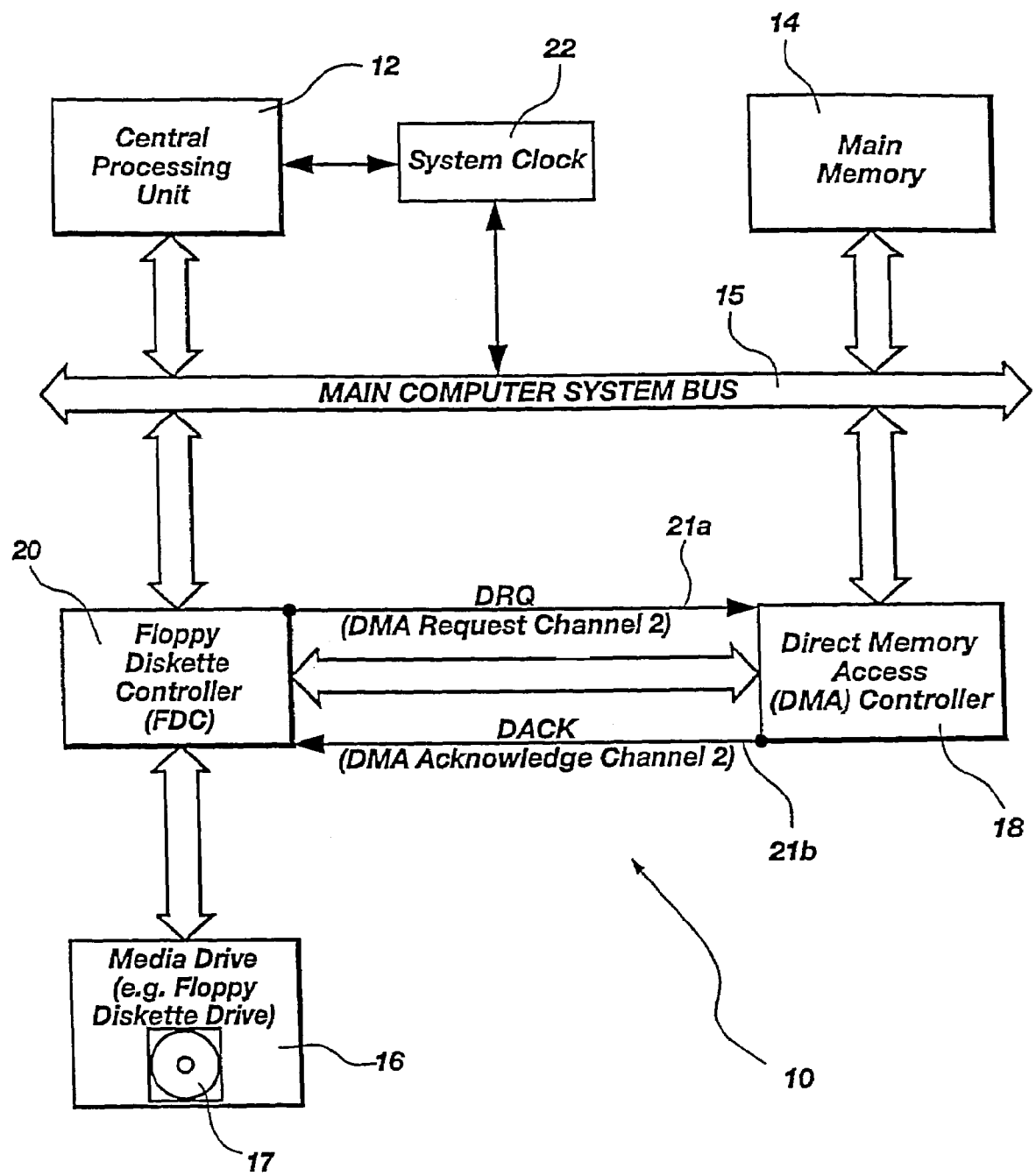
FIG. 1 is a schematic block diagram of an apparatus illustrating the architecture of a computer system for testing a floppy diskette controller ("FDC")in accordance with the invention.

The architecture of an apparatus 10, including a computer system implementing one embodiment of the invention, is illustrated in FIG. 1. A Central Processing Unit ("CPU") 12 and main memory 14 may be connected by a bus 15 inside a computer system unit. Instructions (executables) and data structures used by the CPU 12 are kept in main memory 14 during computer work sessions. Main memory 14 is, however, not a permanent storage place for information; it is active only when the apparatus 10 (computer system) is powered up (on). Thus, to avoid losing data, data must be saved on some type of non-volatile storage device. For example, the apparatus may use a "hard disk" storage device permanently installed in the computer system. A computer system 10 may have at least one floppy diskette drive 16 that receives a removable floppy diskette (magnetic storage medium). The floppy diskette likewise may be used for "permanent" (non-volatile) storage of data or software (executables) outside of the computer system 10 flexible (floppy) diskettes are especially useful for transferring data and information between separate computer systems 10.

In transferring data to a floppy diskette, the CPU 12 may program a Direct Memory Access ("DMA") controller 18 for an input/output ("I/O") transfer. The CPU 12 issues a command to a Floppy Diskette Controller ("FDC") 20 to begin the I/O transfer, and then waits for the FDC 20 to interrupt the CPU 12 with a completion interrupt signal. It is also possible to perform Programmed I/O ("PIO") directly between the CPU 10 and the FDC 20 without involving the DMA controller 18. This latter approach is seldom used; the majority of computer systems 10 employ DMA for I/O transfers to and from the floppy diskette drive 16. The invention will thus be described below with particular reference to the DMA controller 18. If PIO is employed, however, then an I/O transfer is totally controlled by the CPU 12 because the CPU 12 is required to pass each and every data byte to the FDC 16. As a result, the "DMA shadowing" system and method in accordance with the invention may be directly applied to a PIO data stream. This is readily tractable because the CPU 12 already is controlling the I/O transfer, as will become more readily apparent.

A computer system 10 may have a system clock 22. The system clock 22 is beneficial when initiating an I/O transfer to the diskette drive 16 because one must not only control the data transfer, but also a drive motor. In this regard, it is important to know when the diskette drive motor has brought a diskette's spin rate up to a nominal RPM required for a data transfer to be successful.

For example, in IBM Personal Computers and "compatibles," the system clock 22 interrupts the CPU 12 at a rate of 18.2 times per second (roughly once every 54.9 milliseconds). This interrupt is used to determine such things as diskette drive motor start and stop time. There are also a host of other time-dependent operations in the computer system 10 that require this granularity of timing.

Figure 2:
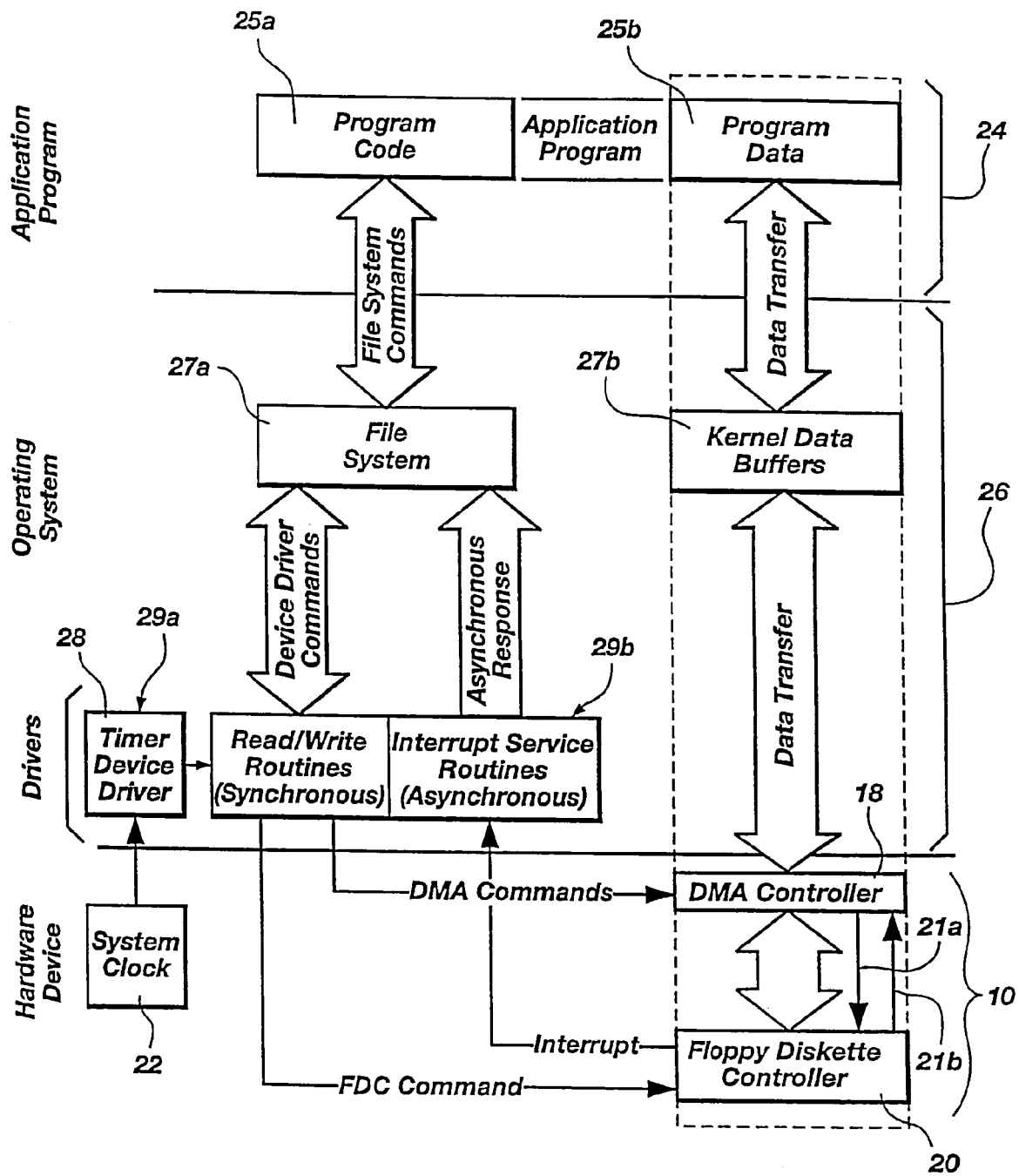
FIG. 2 is a schematic block diagram illustrating software modules executing on the processor and stored in the memory device of FIG. 1, including application programs, operating systems, device drivers and computer system hardware such as a floppy diskette.

One presently preferred embodiment of an association between application programs 24 (executables), operating systems 26, device drivers and hardware is depicted in FIG. 2.

The example presented corresponds to a floppy diskette having a controller 16.

A system suitable for implementing the invention may include an application program 24 including both executable code 25a and associated data 25b. The application 24 may interface with the hardware apparatus 10 through an operating system 26. The operating system may include a file system 27a as well as selected buffers 27b. The file system 27a may include an executable for file system management as well as operating system interfacing. The file system 27a may issue commands to drivers 28.

The drivers 28 may include a timer device driver 29a, including a timer ISR, interfacing to the system clock 22. Likewise, a media drive driver 29b, alternatively referred to as a media driver 29b may be included. The media driver may interface with a floppy diskette drive or other media drive 16 to maintain persistent storage on media 17. Although a media drive 16 may typically relate to floppy diskettes, tape drives and other magnetic media may also be used in an apparatus and method in accordance with the invention.

The media driver 29b may be responsible for sending instructions and control signals to the media drive controller 20, which is typically embodied as a floppy diskette controller 20. Similarly, the media driver 29b may instruct and control the DMA controller 18. The DMA controller manages data transfers between the floppy diskette controller (FDC 20) and the main memory device 14. A DMA request (DRQ;DREQ 21a) may pass from FDC controller 20 to the direct memory access controller 18 (DMA controller 18). Likewise, a DMA acknowledge 21b or acknowledgment 21b, alternatively referred to as a (DACK 21b) may be returned from the DMA controller 18 to the FDC 20.

Figure 3:
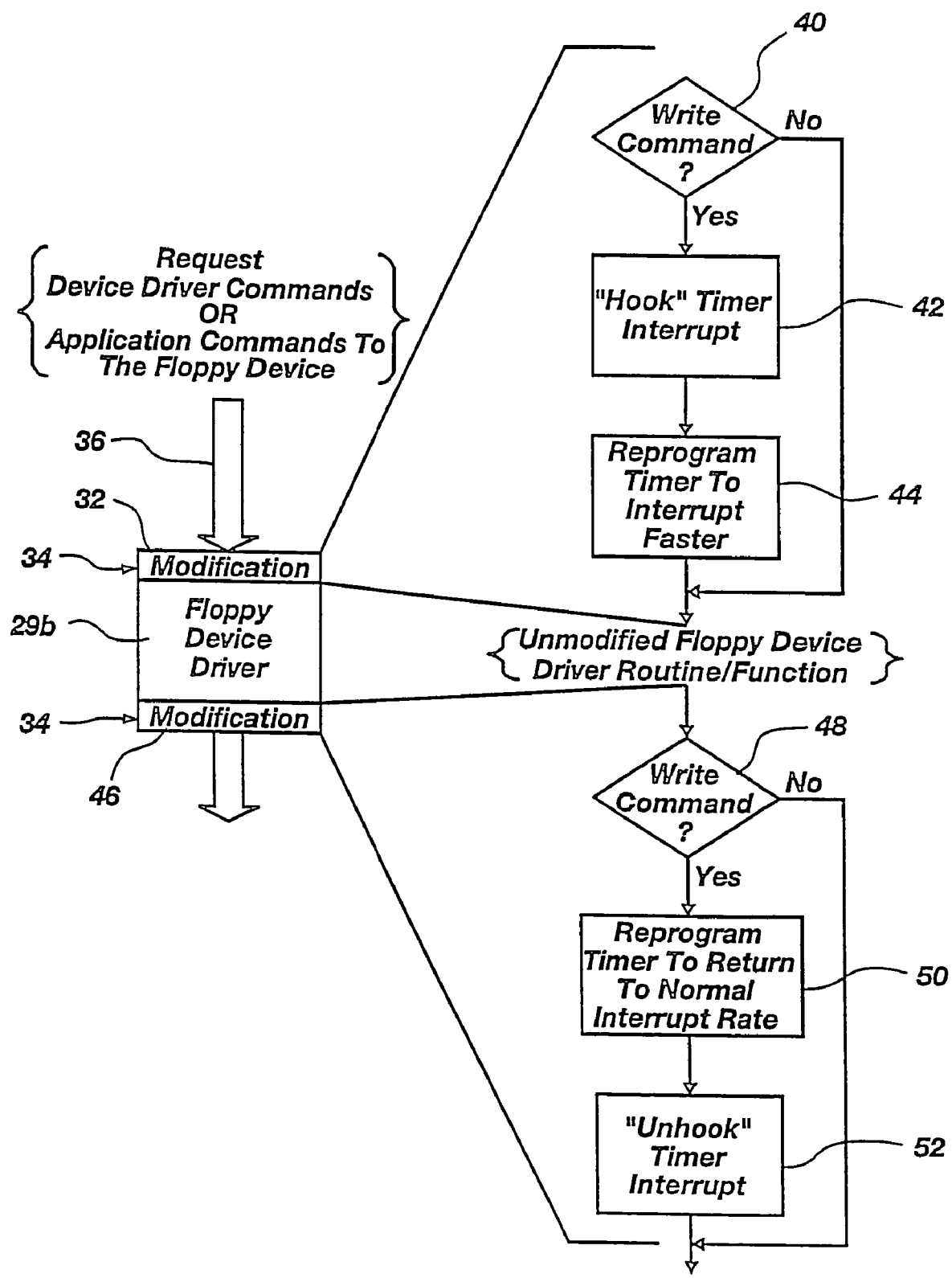
FIG. 3 is a schematic block diagram of a flow chart depicting one presently preferred embodiment of certain modifications that may be applied to a diskette device driver in order to force an otherwise undetected error condition to occur in a defective FDC, thus enabling the defective FDC detection apparatus and method of the present invention to be activated.
Figure 4:
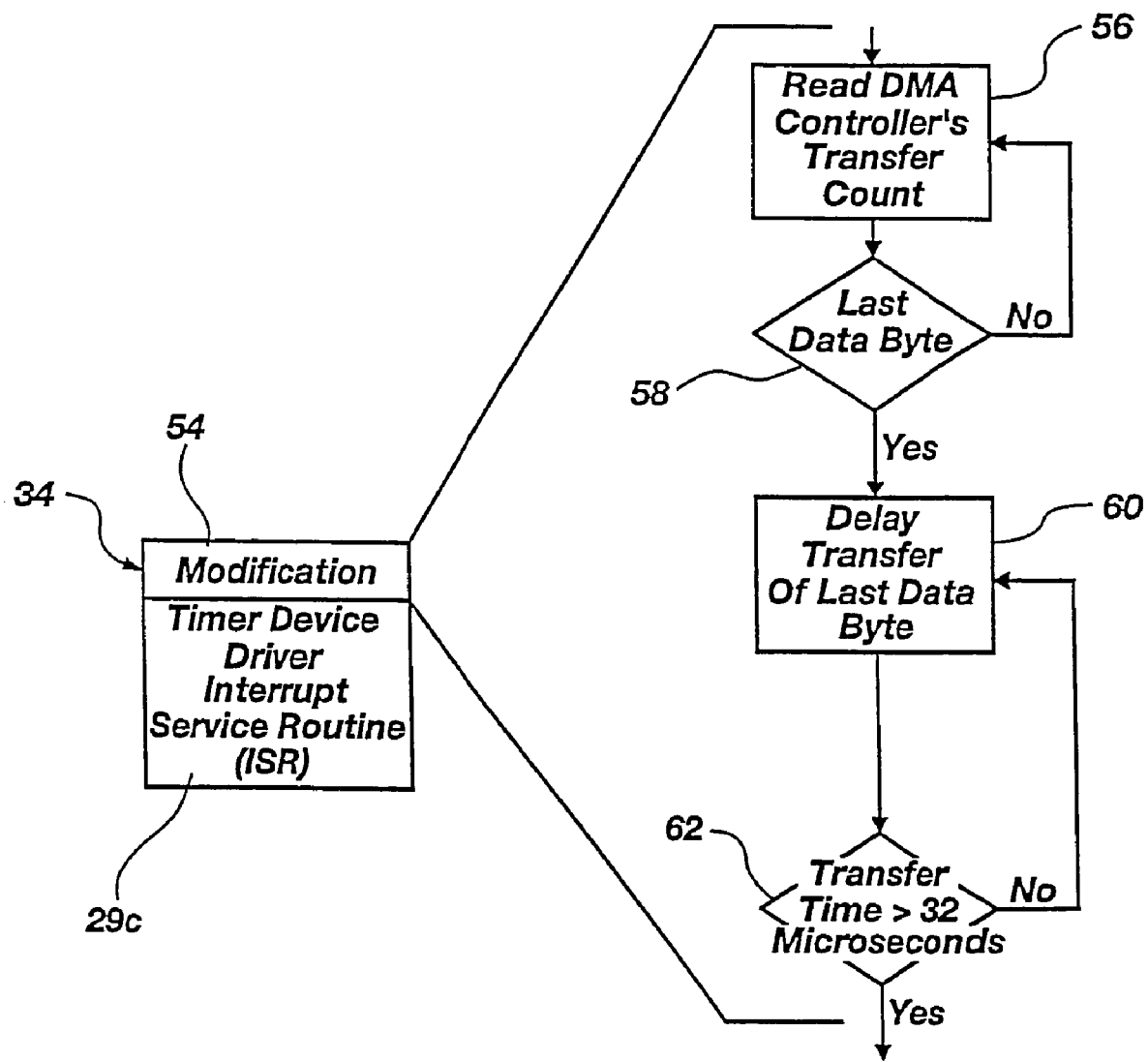
FIG. 4 is a schematic block diagram of a flow chart depicting one presently preferred embodiment of certain modifications that may be made to a timer Interrupt Service Routine ("ISR") to allow timing of a transfer byte's DMA request and DMA acknowledge (DREQ/DACK) cycle in order to ensure that proper conditions exist to create data corruption associated with defective FDCs in accordance with the present invention.
Figure 5:
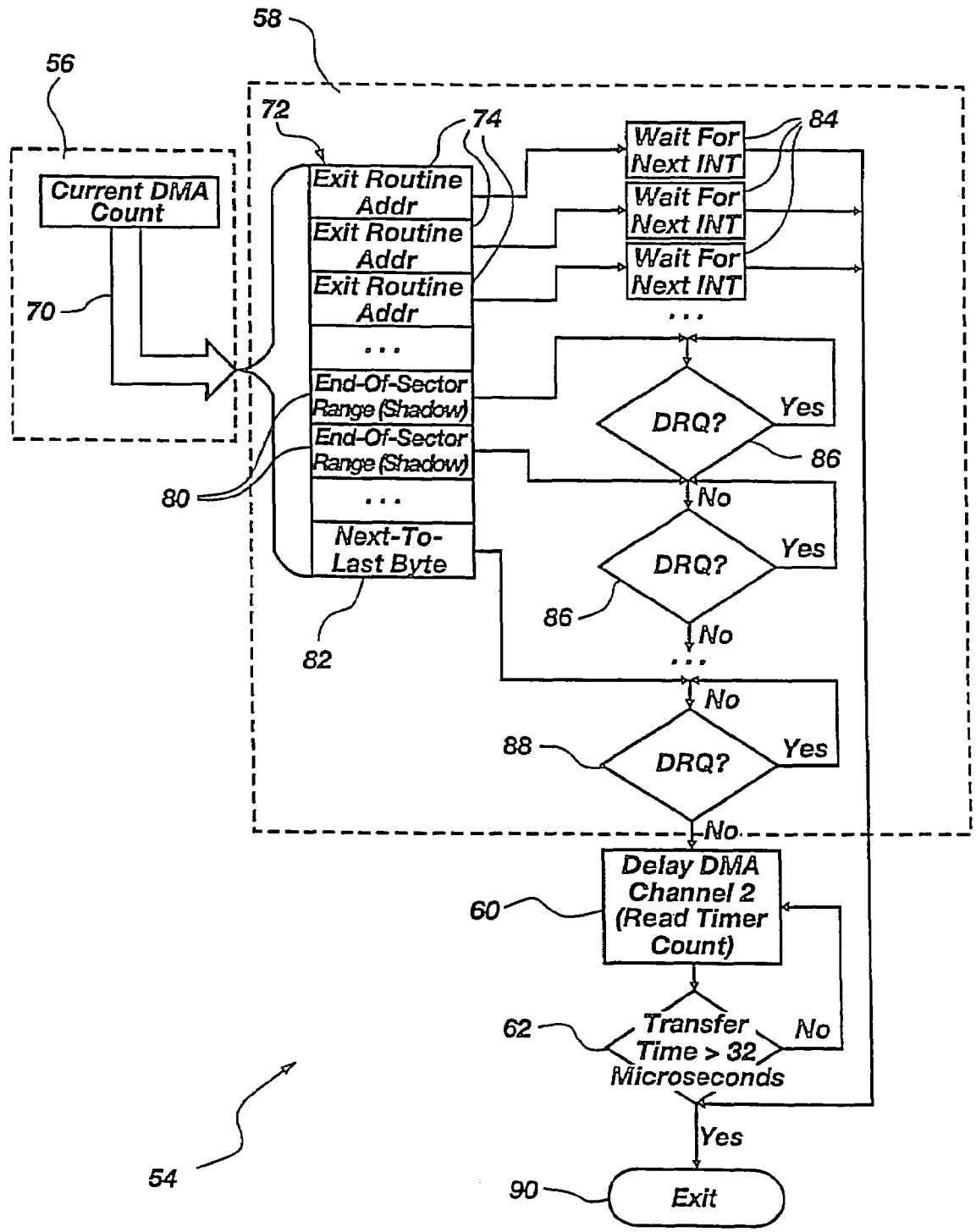
FIG. 5 is a schematic block diagram of a flow chart depicting one presently preferred embodiment of a software decoding network (software vector-table) for use in connection with a defective FDC detection apparatus and method in accordance with the present invention, the software decoding network having one code point/entry for each possible transfer byte in a sector.

Referring now to FIGS. 3-5, and more particularly FIGS. 3 and 4, a method in accordance with the present invention include a module 32, one of several interposer routines 34, which is placed between an application's 24 request 36 for floppy service and a floppy device driver 29b. The interposer routine 32 is actually a new or modified device driver that forces certain undetected FDC data corruption conditions to exist. As shown, the interposer 32 first tests 40 whether an operation requested 36 is a floppy diskette write operation. Read operations are equally susceptible to the problem and may be used in the detection process, if desired. If so, the major function of the interposer 32 is to insert itself between the application request 36 for floppy service and the floppy device driver 29b that will service the request. In a PC/MS-DOS environment, this can be accomplished by "hooking" the INT 0×13 interrupt vector and directing it to the FDD prefix 32 or interposer routine 32. Reprogramming 44 the timer 22 to interrupt faster (e.g., every 4-7 milliseconds) than normal (e.g. 54.9 milliseconds).

As will become more fully apparent from the following discussion, once a floppy write operation is detected, in a test 40 a software decoding network call vector of the timer interrupt 54 (see FIGS. 4-5) is preferably installed. The current byte count is read 56, and DMA shadowing 58 begins. When a test 58 shows that a current DMA transfer count (countdown) has reached 0, then the interposer routine 54 delays 60 the DMA transfer of the last byte of the sector transfer. The delay continues until a test 62 determines that the elapsed time is greater than the maximum time required for a data byte to be transferred to the medium 17 (e.g. a low-density diskette; >32 uSec).

This delay 60 forces defective FDCs 20 into an undetected data corruption condition. This condition can be tested 120 by reading back 118 the written data to see whether the last byte or the next-to-the-last byte was actually written to the last byte location of the sector.

Referring again to FIG. 3, the system clock 22 may be reprogrammed 50 in a suffix routine 46 appended to the floppy device driver 29b. The system clock 22 may then interrupt normally (e.g., every 54.9 milliseconds). The timer interrupt 54 is "unhooked" 50 until the test 40 reports the next floppy write operation.

One could allow the timer 22 (clock 22) to always interrupt at the accelerated rate. Then, a check the timer Interrupt Service Routine ("ISR") 29c (see FIG. 4), within the timer device driver 29a, may then determine whether a media (e.g. diskette) write operation is active. Likewise, it is possible to randomly check to see if the last byte of a floppy sector write operation is in progress. However, the foregoing method has superior efficiency and accuracy in creating the condition required for the detection of defective FDCs.

As used herein, "DMA shadowing" may be thought of as programmatic CPU 12 monitoring of data (byte) transfers and timing the last byte of a sector's DREQ 21a to DACK 21b signals. Importantly, there are, of course, a number of ways of determining when the DREQ 21a is present and when the DACK 21b is present. The present invention may include the use of any "DMA shadowing" whether the DREQ 21a and DACK 21b signals are detected at the DMA controller 18, CPU 12, system bus 15 or FDC 20. This includes both explicit means, and implicit means.

For example, inferring the state of the DREQ/DACK cycle is possible from various components in the system that are triggered or reset from transitions of such signals 21a, 21b. In one embodiment the DACK 21b may cause a Terminal Count ("TC") signal to be asserted by the DMA controller 18. Therefore, one may imply from the detection of the TC that a DACK 21b has occurred.

Whenever an application 24 requests a write operation of the media drive 16, the system clock 22 may be reprogrammed to interrupt, for example, every 4 to 7 milliseconds. Referring again to FIGS. 4-5, each time the system clock 22 interrupts, the current byte count in the transfer register (countdown register) DMA controller 18 is read 56. Once the test 58 indicates that the byte counter has reached the last byte, the signal transition from DREQ 21a to DACK 21b may be timed and accordingly delayed 60. This transition may be forced to be greater than the maximum time required to transfer one data byte as indicated in the test 62.

Therefore, defective FDCs 20 are forced into an undetected data corruption state. This state may be detected by writing known data patterns to the next-to-the-last and the last data bytes. Reading the data back will reveal which of the two data bytes was stored in the last byte of the sector. Finally, it is possible to also detect defective FDCs 20 by significantly increasing the delay time during the transfer of the last byte of a sector. This forces the next physically adjacent sector to be zeroed out except for the first byte of that sector.

For the system to maintain proper operation, an interposer routine 34 should save the original INT 0×13 (Hex 13th interrupt vector) contents (address of the original INT 0×13 Interrupt Service Routine) and invoke the original when necessary. Additional aspects of the interposer function 34 are discussed below in connection with other features of the device driver 29b.

This implementation of the apparatus and method of the present invention is contemplated for use on an IBM Personal Computer running the PC/MS-DOS operating system. Versions have, however, been developed to operate in the WINDOWS, OS/2 and UNIX environments and may be embodied for other operating systems. The invention is not limited to use with any particular operating system, and adaptations and changes which may be required for use with other operating systems will be readily apparent to those of ordinary skill in the art.

As depicted graphically in FIG. 4 below, a timer ISR routine 29c is used for servicing the accelerated interrupt rate of the system clock 22. The reason that the system clock interrupt rate is accelerated is that during a normal 512 byte data transfer (the typical sector size) 16 microseconds are required for each data byte to be transferred to the FDC (High Density Diskette Mode). Therefore, a typical sector transfer requires 512 times 16 microseconds, or 8,192 microseconds. If the diskette is a low density diskette then the sector transfer time is doubled to 16,384 microseconds (512 times 32 microseconds) because the FDC has half of the amount of data to store in the same rotational time frame (typically 360 RPM).

Referring to FIG. 5, the timer ISR routine 29c within the timer device driver 29a with its prefix 54 performs checks on the system 10 to determine if the system 10 is actually transferring data to the FDC 20. If a sector transfer is not in progress then the timer ISR prefix 54 exits immediately. However, if a sector transfer is in progress then the timer ISR prefix 54 obtains the remaining byte count of the sector transfer 70 and vectors (jumps) through the software decoding network 72 (DMA count table 72) to an appropriate processing routine 84, 86, 88.

Although the steps 56, 58 of the module 54 may be implemented with the timer 22 continually interrupting every 8, 16, or 32 microseconds. This level of interrupts may totally consume a PC's processing power, and on most PCs could not be sustained. Thus, in order to perform DMA shadowing without affecting the total system performance it is important to allow normal operations to continue as usual. It is desirable to have an interrupt (the system clock 22) that will interrupt close to the end of the sector transfer so that the DREQ 21a to DACK 21b timing may be determined on the last byte of the sector transfer.

Thus, it is possible to DMA shadow 58 all 512 bytes during a sector transfer, but that would cause the CPU to be totally consumed during the entire sector transfer time. The potential of losing processing activities elsewhere in the system are greatly increased, as in serial communications. Therefore, the clock interrupt routine 29c or method 29c of FIG. 5 may reduce the CPU involvement to a bare minimum during those floppy write operations with DMA Shadowing. Significantly, the timing may be adjusted to any number of bytes of a sector transfer, from a few bytes to the entire sector count.

One operation performed in the timer ISR routine 29c is to vector through the software decoding network 72 to the appropriate processing routine 84, 86, 88. This process is illustrated graphically in FIG. 5. The software decoding network 72 (software vector-table 72) has one code point/entry 74, 80, 82 for each possible transfer byte in the sector.

The timer interrupt rate can now be in terms of 10's or 100's of byte transfer times. The vector table 72 may cause the program execution of the CPU 12 to enter a cascade 86 of DREQ 21a/DACK 21b checks only when the transfer (sector) will complete prior to the next timer interrupt. In short, the first entries 74 in the vector table 72 will return 84, since another timer interrupt will occur before the sector transfer completes. The latter entries 80, within the desired range, will cascade 86 from one DREQ 21a/DACK 21b detection to another (shadowing 58 the DMA transfers) until the last byte is transferred.

On the last byte being transferred, the data byte may be delayed by either activating a higher priority DMA 18 channel or masking the DMA channel of the FDC 20. Although these two techniques are the simplest to program, numerous alternatives may be used to delay 60 data transfers on the DMA 18 channel of the FDC 20, in accordance with the invention.

This software decoding network process 54 is the fastest known software technique for decoding and executing time-dependent situations. Space in the memory space 14 (e.g. the software decoding network vector table 72) is traded for processing time, the amount of time it would take for one routine to subsume all functionality encoded in each of the routines 84, 86, 88 vectored to through the software decoding network vector table 72.

As indicated above, the entire software decoding network table 72 may be initially set to the address of an "exiting routine 84." Then depending upon how slow or fast the system clock 22 interrupts, a certain number of the lower-indexed entries 80 of the table 72 may be set to the address of a processing routine 86. These processing routines 86 may be identical and sequentially located in the routine 54. Thus, the software decoding network vector table 72 may simply vector the timer ISR routine 29c within the driver 29a to the first of n sequentially executed processing routines. Here, n represents the number of bytes remaining in the sector transfer. In this way the last few bytes of the sector transfer can be accurately monitored (DMA Shadowing 58) without significantly affecting overall system performance.

Each of the processing routines 86, except the last one 88, may perform exactly the same function. It is not necessary to be concerned with the timing between the DREQ 21a and DACK 21b signals until the very last data byte of a transfer. Therefore, the routines 86, 88 above "shadow" 58 the operation of the DMA until the last byte (e.g. corresponding to entry 82 of the vector 72) at which time the DMA channel of the FDC 20 is delayed as previously described.

Figure 6:
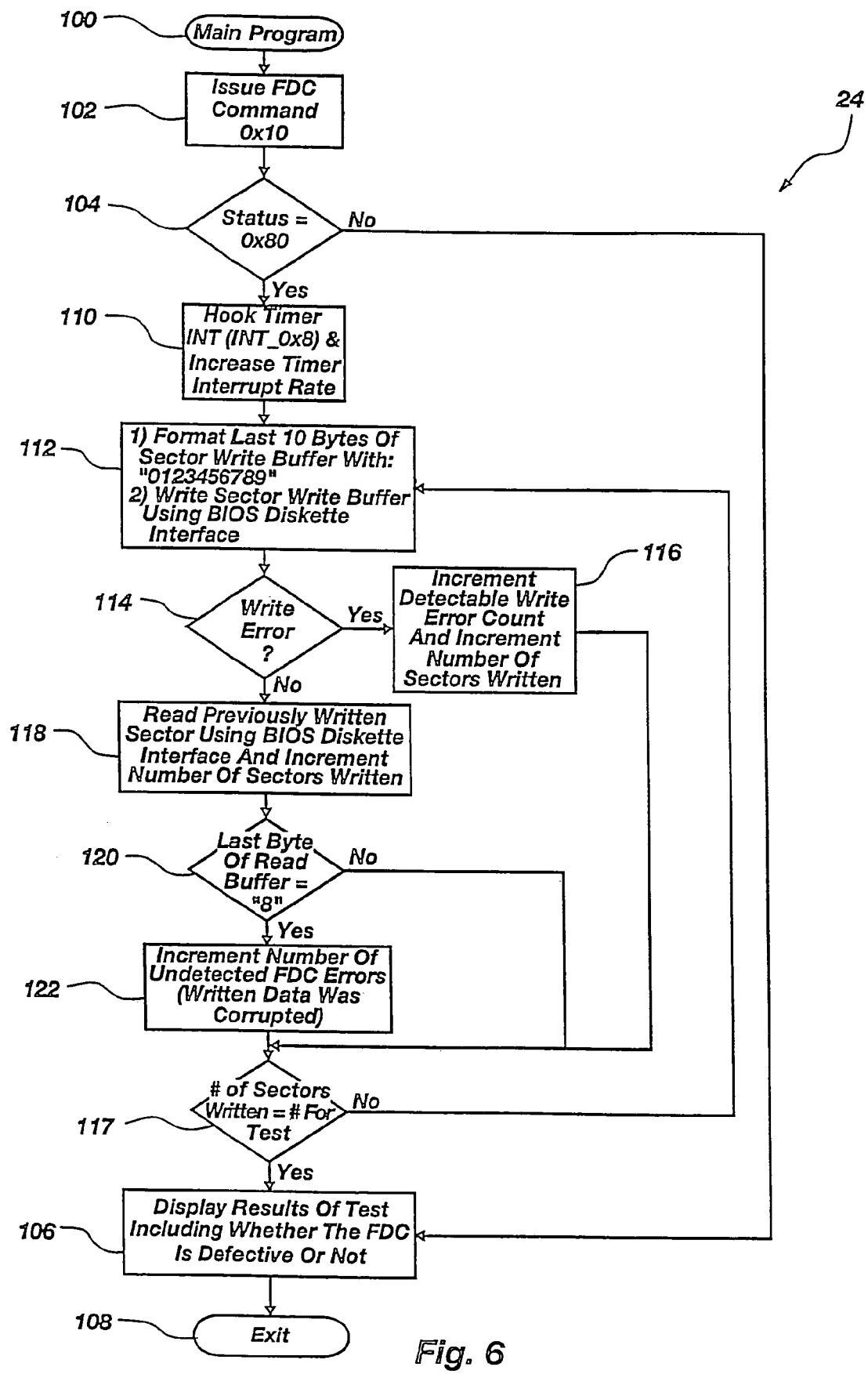
FIG. 6 is a schematic block diagram of a flow chart depicting one presently preferred embodiment of an application implementation of the apparatus and method of FIGS. 3 and 4, wherein a main "driver" portion of an application forces an undetected error condition in a defective FDC enabling activation of a the defective FDC detection system in accordance with the invention.

Thus, through software DMA shadowing, it is possible to reliably determine when the last byte of the transfer is about to be transferred. Therefore, it is possible to force the last data byte's transfer to be delayed. An alternative approach may include a specialized application program 24 to control all aspects of the operation of the media drive 16, e.g. floppy diskette drive 16. This may include a transfer delay of a last byte, as indicated in FIGS. 6 (main application) and 7 (timer interrupt service routine). All aspects of the previous approach may be present. However, here they may be collected into a single application program 24 performing the required functions. The application program 24 may reprogram the system clock to interrupt at an accelerated rate and services the interrupt itself. The application program may then begin a repeated set of diskette write operations using the BIOS interface interrupt (O×13) and then read the written sectors back. Once the sector has been written and read back the data is compared to determine whether or not an undetected error has occurred. A running total of both detected and undetected errors may be output to a display.

Referring now to FIG. 6, an application 24 may include steps 110-117. Alternatively, preprocessing may begin at an entry point 100 leading to an initial command 102. Command 102 is effective to request of a floppy diskette controller (FDC) 20 an identification. A status return of 0×90 (hexadecimal 90) should indicate that a FDC 20 is not of the type that is per se defective. However, faulty programming has now falsified the response fed to the test 104 in certain chips. Therefore, the command 102 may give rise to a false status return of 0×90 hexadecimal 90. This return does not guarantee that an FDC 20 is not defective.

Thus, a test 104 does not actually determine whether or not the status of an FDC 20 is defective. A negative response instead may be saved 105 to establish false negative responses programmed in by manufacturers. The display step 106 may include selected post processing to output results of the application 24. Results may include, for example, an indication of whether the FDC 20 being tested is defective or not and whether a false negative response was given to test 104, in view of the results of the test 112. Accordingly, a status not equal to a hex 80 would ordinarily result in the test 104 signifying that an FDC 20 is not defective. The steps 105, 106 thereafter verify defectiveness and improper circumvention of the test 104.

After to the test 104, the application 24 advances to a hook 110. The hook 110 is effective to interpose a timer prefix 124 (see FIG. 7) corresponding the prefix 34 of FIG. 3, to be installed to operate at the beginning of a timer ISR 29c within the timer device driver 29a.

A test pattern 112 may format the last few (for example, 10) bytes of a sector write buffer 27b. Any known pattern may suffice, for example, a sequential list of all digits from zero to nine may be used. Importantly, the last two digits in such a sequence should be distinct. Thus, a string "0123456789" may provide a test pattern to be written in the last ten bytes of a sector. The test pattern may then be written from a buffer 27b to a medium 17 using the BIOS interface for the medium 17 and medium drive 16.

Following the test pattern 112, a test 114 may determine whether or not a write error has occurred in writing the buffer 27b to the medium 17. A positive response to the test 114 results in an increment step 116. The increment 116 tracks the number of successful detections of errors. Thus, the increment 116 indicates that another write error was successfully detected by the FDC 20. Accordingly, the application 24 may advance from the increment 116 to a test 117. A test 117 may determine the number of sectors to which the FDC 20 has attempted to write. If the response to the comparison of the test 117 is positive, then all tests are completed and the display step 106 follows. On the contrary, a negative response to this test 117 returns the application 24 to the test pattern 112, initiating another test cycle.

A negative response to the test 114 indicates that a write error, known to exist, was undetected by the FDC 20. Accordingly, a negative response to the test 114 advances the application 24 to a read 118. The read 118 reads back the last previously written sector, using the BIOS diskette interface, such as the driver 29b. The step 118 may then increment the number corresponding to sectors that the FDC 20 has attempted to write.

The application 24 may next advance to the test 120 to determine whether the last byte that the read step 118 has read back from the written sector to a buffer 27b is the last, or the next-to-last element of the test pattern from the test pattern step 112. That is, for example, in the example above, the test 120 determines whether or not the last byte read back to the buffer 27b from this sector being tested is correct (e.g. 9, a value other than 9 indicates that the FDC has failed to write the tenth element of the test pattern into the last byte location of the sector). This indicates that the FDC has not indicated a write error in the test 114, and yet has produced the error detected by the test 120. Thus, the last sector written is corrupted.

A negative response to the test 120 indicates that the last byte was not incorrectly written. Accordingly, the application 24 may advance to the test 117 to determine whether or not the testing is completed. A positive response to the test 120 results in an increment step 122. The increment step 122 advances the count of undetected errors found during the operation of the FDC 20 during the testing in question. Thus, a step 122 results in a corruption count for sectors attempted to be written by the FDC 20.

Figure 7:
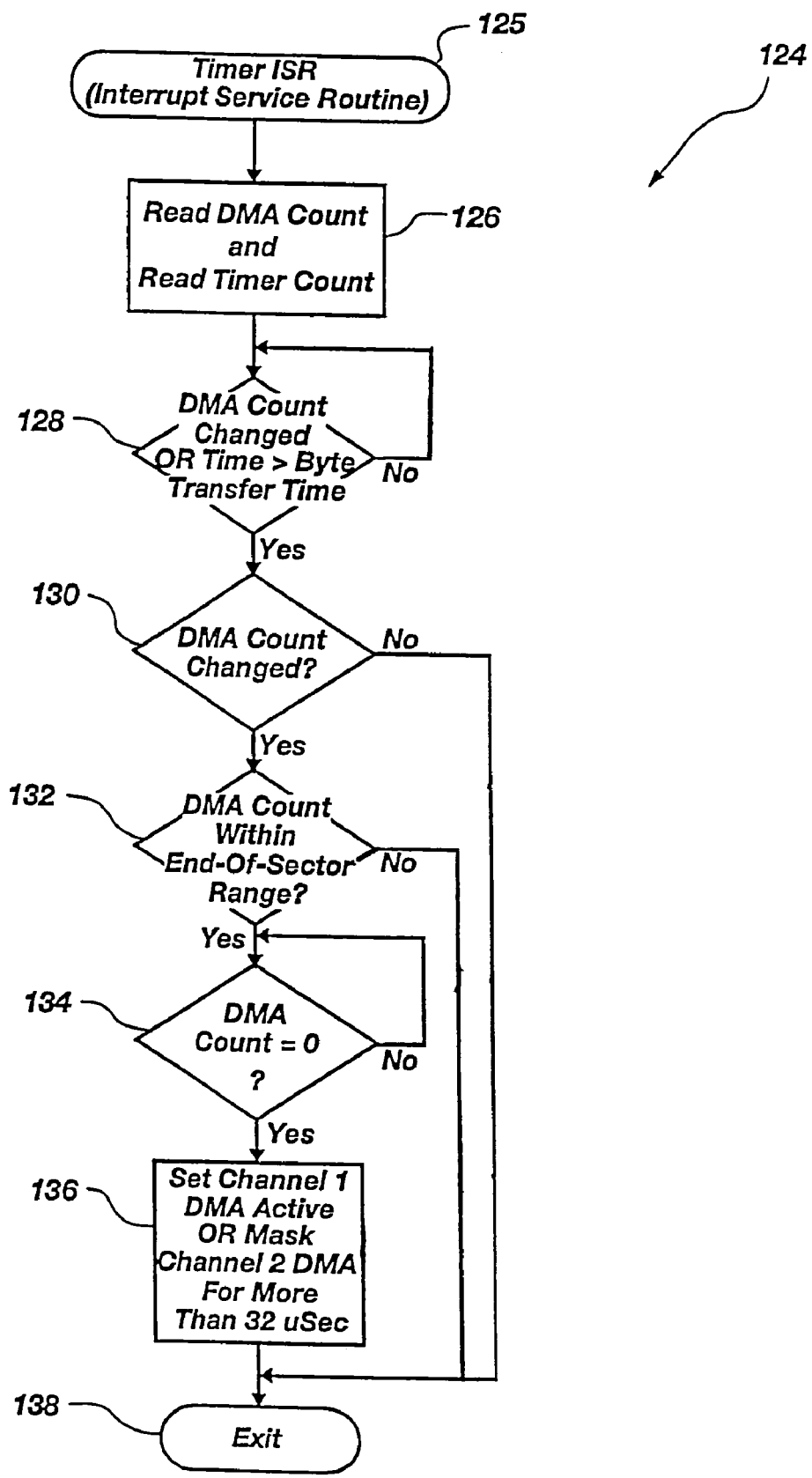
FIG. 7 is a schematic block diagram of a flow chart depicting one presently preferred embodiment of certain modifications that may be made to a timer Interrupt Service Routine embedded within the application of FIG. 6 to allow timing of a last byte's DREQ/DACK cycle, ensuring that proper conditions exist to create data corruption associated with defective FDCs in accordance with the present invention.

Referring now to FIG. 7, and also cross-referencing to FIG. 6, the hook step 110 may install a prefix 54 to a timer ISR 29c within the timer device driver 29a (see FIG. 4). The hook 110 interposes the prefix 124 corresponding to the prefix 54 of FIG. 4, after a call 125 or entry point 125 to the timer ISR 29c within the timer device driver 29a. Accordingly, whenever the timer ISR 29c within the timer device driver 29a is called, the prefix 124 will be run before any executables in the timer ISR 29c within the timer device driver 29a.

The prefix 124 may begin with a read 126 effective to determine a count corresponding to the number of bytes, or a countdown of the remaining bytes, being transferred by the DMA controller 18 from the main memory 14, through the buffer 27b to the FDC 20. The read 126 may also include a reading of a count (a tick count) of a timer 22 or system clock 22.

Following the read 126, a test 128 may determine whether or not an operation is in process affecting the FDC 20. The FDC 20 is in operation if a count kept by the DMA controller 18 has decremented (changed) within an elapsed time corresponding to the maximum time required for a byte to be transferred. If no change has occurred during that elapsed time, then one may deduce that no activity is occurring. Accordingly, a negative response to the test 128 results in reexecution of the test 128. Reexecution of the test 128 may continue until a positive response is obtained. Inasmuch as the application 24 is executing a write during the test pattern 112, an eventual positive response to the test 128 is assured. In one embodiment of an apparatus and method in accordance with the invention, the first byte transferred may typically be detected.

A positive response to the test 128 advances the prefix routine 124 to a test 130 to test the countdown or count of the DMA controller 18. The test 128 corresponds to detection of activity, whereas the test 130 corresponds to iteration of a shadowing process.

The test 130, whenever a negative response is received, may advance the prefix routine 124 to the exit 138.

On the other hand, a positive response to the test 130 advances the prefix routine 124 to a test 132 effective to evaluate whether or not the countdown is within some selected range at the end of a sector. A negative response to the test 132 indicates that the countdown is not within some desired end-of-sector range, so the prefix routine 124 should exit 138 without waiting longer. That is, interrupts will continue to occur with a frequency that will detect the desired range at the end of the sector being tested.

A positive response to the test 132 advances the prefix routine 124 to a test 134 for detecting the last byte to be transferred in a sector. If the DMA controller 18 is not counting the last byte to be transferred, then the test 134 may simply continue to test. When the countdown of the DMA controller 18 reaches a value of zero, a positive response to the test 134 advances to a delay step 136.

The delay step 136 corresponds to the delay 60 illustrated in FIGS. 4-5. The delay 136 may be implemented by preempting a channel over which the DMA controller 18 is communicating with the FDC 20. For example, a first channel may be made active by some process, thus, overwriting communication over some channel having lesser priority, and corresponding to the FDC 20. Likewise, the channel corresponding to the DMA communication with the FDC 20 may be masked (suspended) until the time elapsed for the transfer of the data to the sector has exceeded the maximum time permitted for such transfer. Thus, any and all opportunities for writing the last byte to the sector had expired. Thus, an error condition has been assured. Once the delay 136 has assured an error condition the exit 138 returns control of the processor 12 to the non-interrupted processing state.

Figure 8:
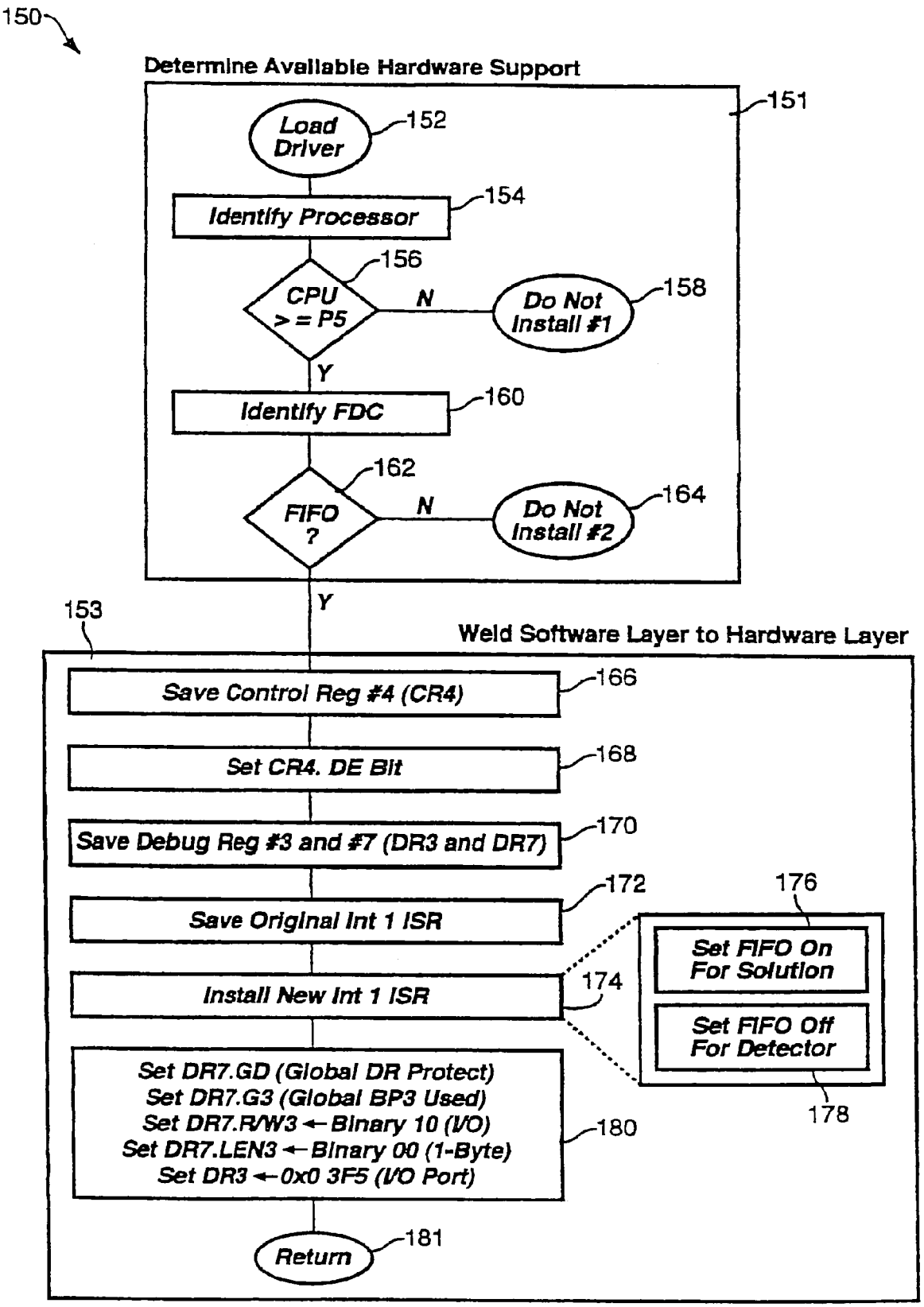
FIG. 8 is a schematic block diagram of a method for welding a software layer to a hardware layer in accordance with the invention.

Referring to FIG. 8 specifically and FIGS. 8-15 generally, an overview at a high level of abstraction shows an overarching process for implementing a welding process. A process 150 may include a determination 151 of available hardware and support in a computer system. Accordingly a welding process 153 may weld a software layer to a hardware lay such that other software cannot defeat the connection therebetween. In FIGS. 9A-9B, exit messages 182, 186 result from failures of tests 156, 162.

Figure 10:
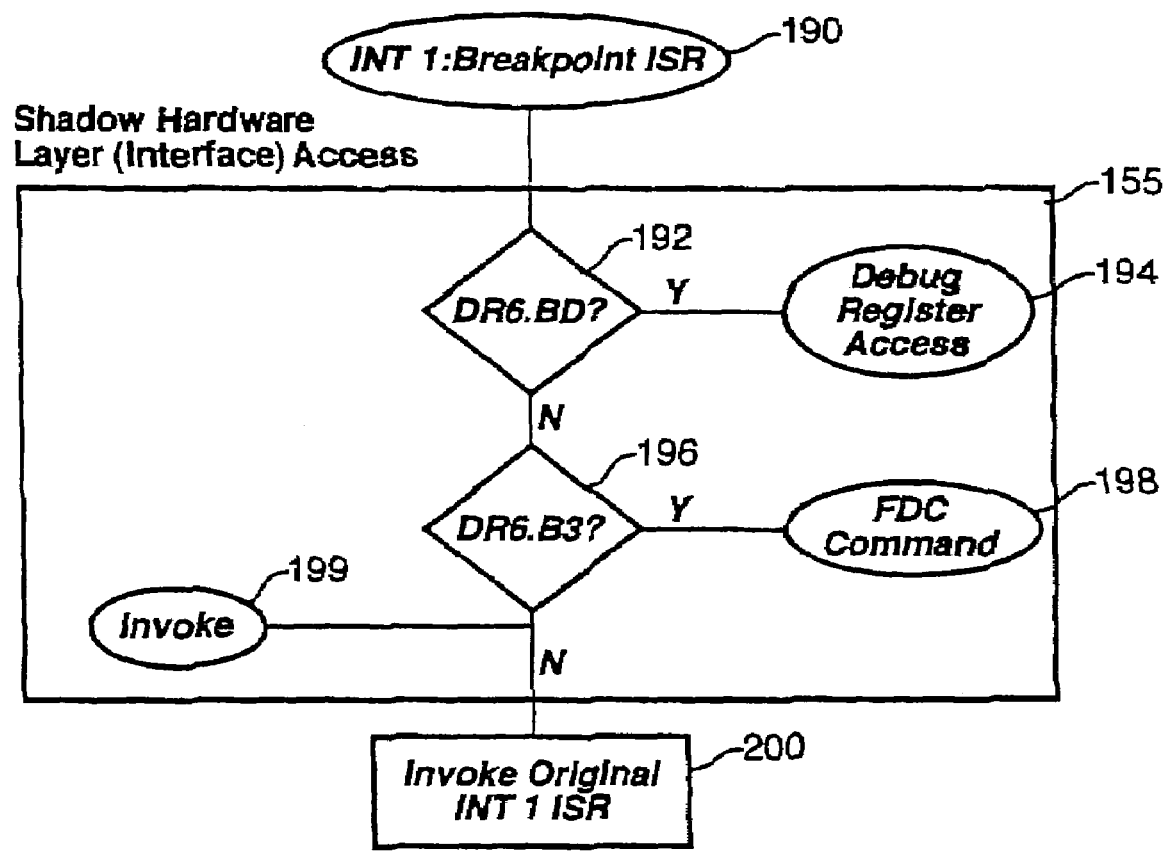
FIG. 10 is a schematic block diagram of a method for a shadowing hardware layer interface access.
Figure 11:
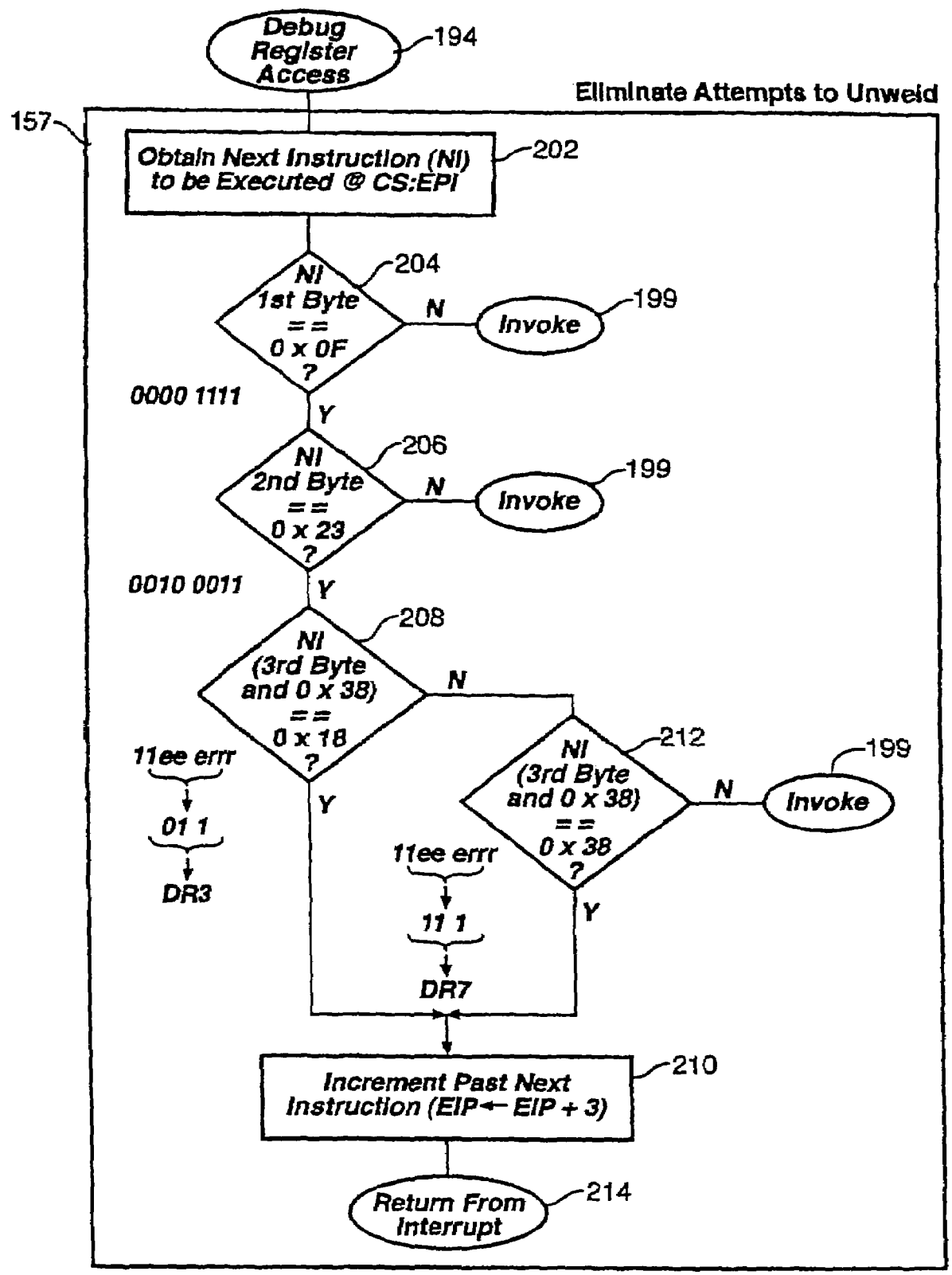
FIG. 11 is a schematic block diagram of a method for eliminating attempts by other software to unweld the connection between a persistent software module and the hardware.
Figure 13:
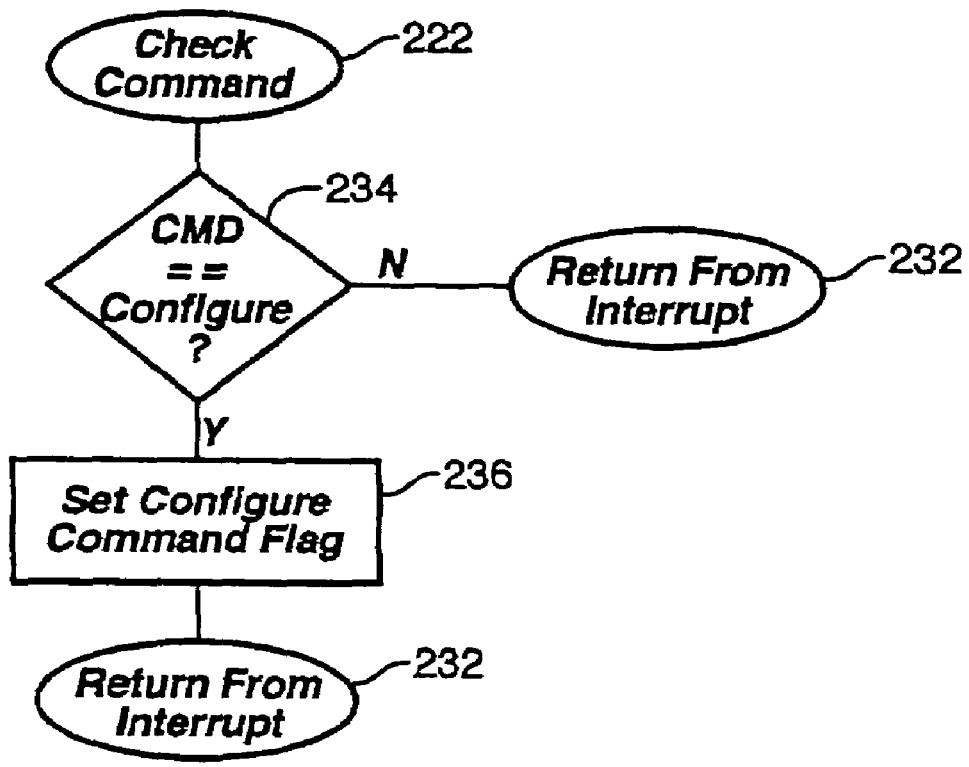
FIG. 13 is a schematic block diagram of the details of a check command in accordance with the invention.
Figure 14:
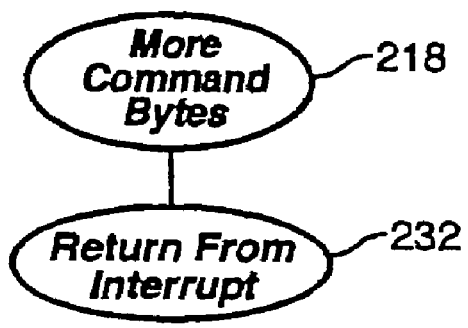
FIG. 14 is a schematic block diagram of more command bytes that may be provided in accordance with the embodiment of FIG. 1.
Figure 15:
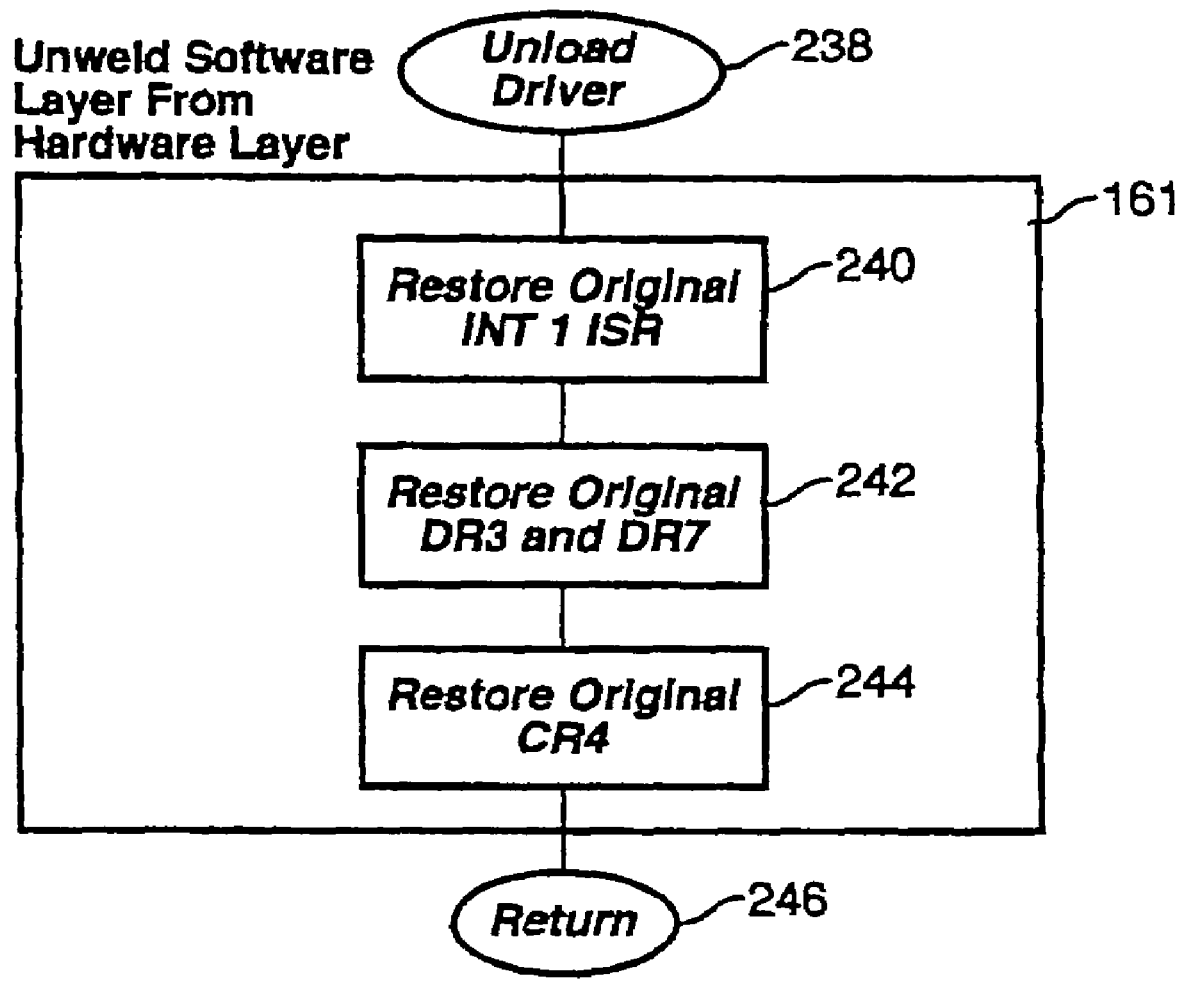
FIG. 15 is a schematic block diagram of a method for unwelding the persistent software layer from the hardware layer upon completion of the need for the functionality thereof.
Figure 16:
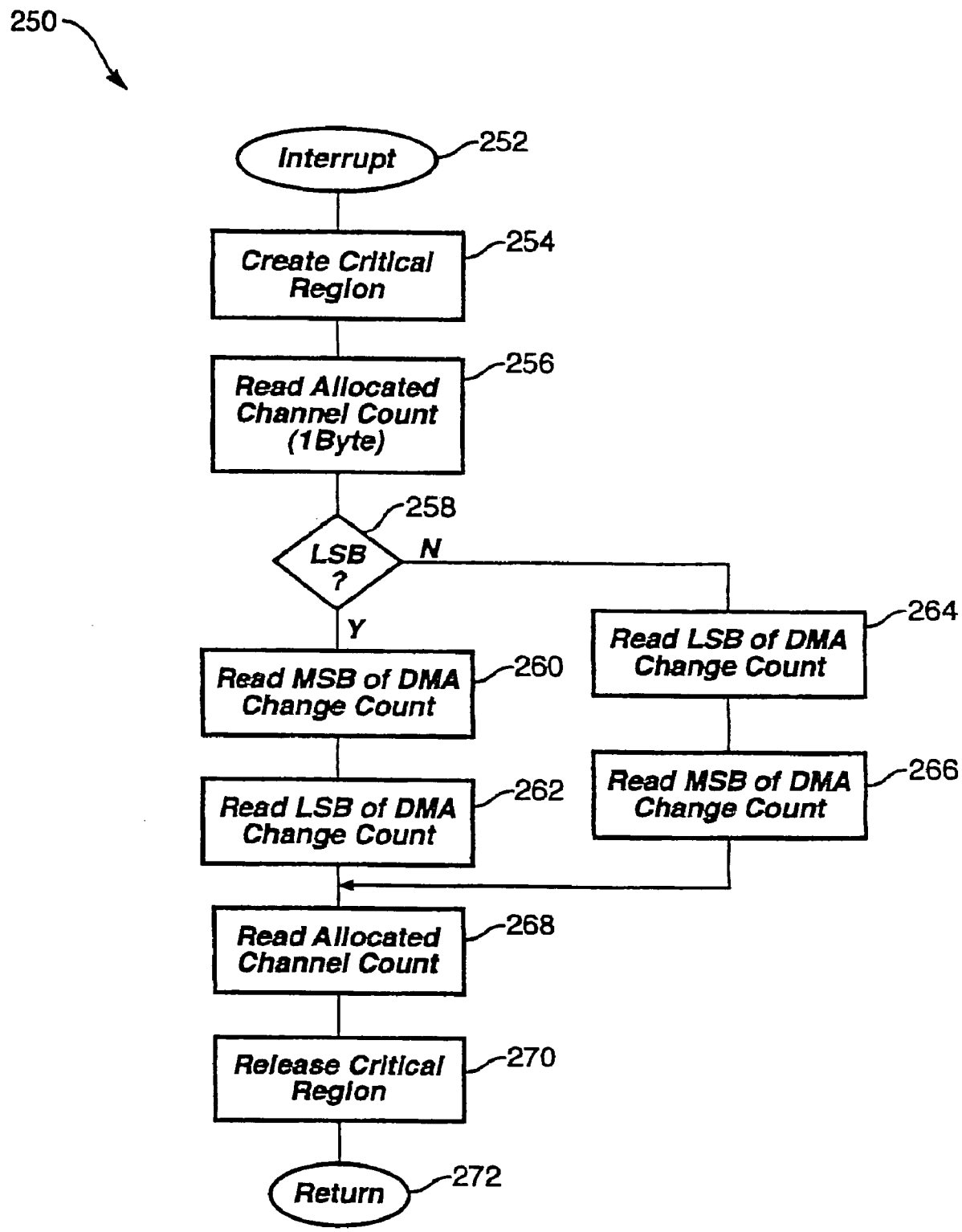
FIG. 16 is a schematic block diagram of a process for ordering the reading of the least and most significant bytes in a critical region.

Meanwhile, referring to FIG. 10, a shadowing process 155 may be one form of ISR in the method of FIG. 8, while FIG. 11 illustrates a defense process 157 for eliminating, defeating, or otherwise defending against attempts by other software to unweld a persistent software function 159 (See FIG. 12) from an underlying hardware device or resource. FIGS. 13-14 illustrate a check and other command bytes that may result from the method of FIG. 8. FIG. 15 illustrates a method 161 for unwelding the persistent software function, but only by the module responsible for effecting the welding process.

Referring to FIG. 8 to review in more detail a specific embodiment for implementing a software correction of a hardware state, a process 150 in accordance with the invention may address FDC controllers that are configured to operate with a first-in-first-out (FIFO) architecture. In such an embodiment, a process 152 for loading 152 a driver for a hardware resource (e.g. peripheral device) leads to identifying 154 the processor executing the instructions. Thereafter, a test 156 determines whether or not the processor is a PENTIUM (P5) type or equivalent, or not If the device is not, then a do-not-install step 158 is initiated. The step 158 is one of two similar actions.

By contrast, if the test 156 results in a device that is at least as current, or more current than a P5 architecture, then identifying 160 the floppy diskette controller is useful. The identifying step 160 corresponds to a floppy diskette controller, which may control more than floppy diskette types of media. After identifying 160 the nature of the floppy diskette controller (FDC), a test 162 determines whether or not the FDC operates with FIFO enablement. If not, then a do-not-install step 164 follows.

Otherwise, for FIFO-enabled FDCs, a save step 166 saves the content from a control register no. 4 (CR4). Next, the bit assigned to the CR4.DE location is set 168. By the setting 168, the save step 166 is effectively required. Otherwise, the setting step 168 destroys irretrievably the contents of the CR4, control register no. 4, contents.

A saving step 170 saves to another location the contents of the debug register no. 7 (DR7). The saving step 170 may also save debug register no. 3 (DR3). Saving 172 an original interrupt service routine, associated with a first interrupt, then provides installation 174 of a new or alternative interrupt service routine (ISR).

In the installing step 174, a setting step 176 may set the FIFO to an "on" state if executing a solution to the read/write defect of an FDC. The solution represents a curing of the hardware defect of the chip by operating the software solution as described above. Alternatively, setting 178 the FIFO to an "off" state is used for the detection process. The detection process is the determination of whether or not the subject chip has the hardware defect detected and solved by the instant invention.

Following installation 174, a setting step 180 sets values of various debug registers in sequence. For example, a global protect may be set, followed by a global use of a Break Point Register no. 3 (BP3). Thereafter, a binary value of 10 may be set for purposes of controlling input and output. Then, a single byte may be set for a length (LEN3). Finally, an input and output port may be set using the debug register (DR3). Thereafter, the process 150 may return 181.

Figure 9A:
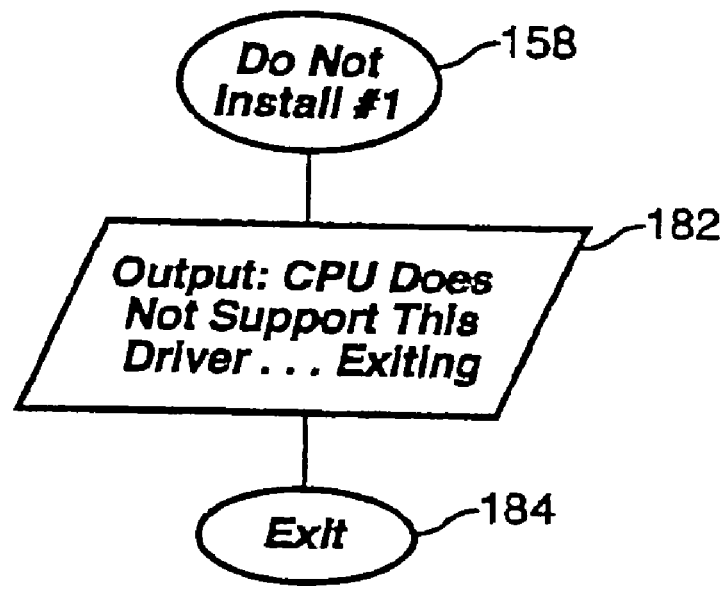
FIGS. 9A and 9B are schematic block diagrams of details corresponding to an instruction not to install, as resulting from the process of FIG. 8.

Referring to FIG. 9A (e.g. see FIGS. 9A and 9B), the details of the do-not-install step 158 are straightforward. An output step 182 provides a message or indication that the processor does not support the current driver. A lack of support causes an exit. Accordingly, the process 150 is not completed otherwise.

Figure 9B:
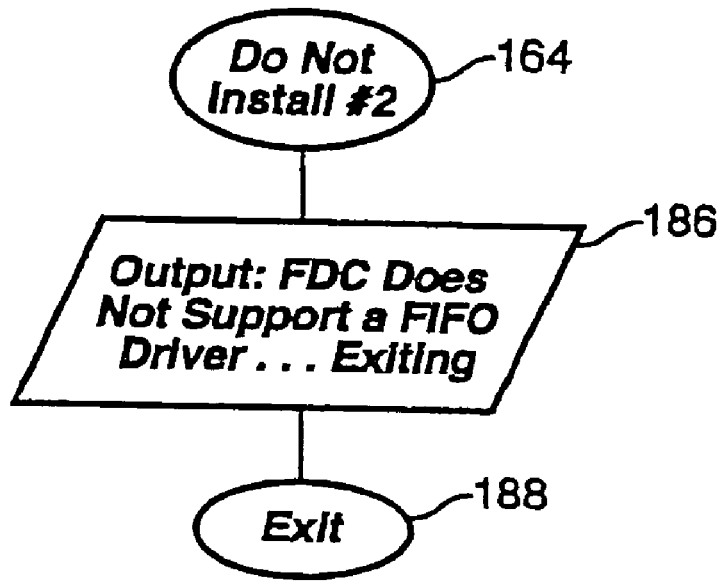

Referring to FIG. 9B, the do-not-install step 164 provides a different output 186. The output includes a message, warning, signal, or the like indicating that the subject FDC does not support a FIFO architecture. Accordingly, the driver must exit 188. Thus, the process 150 terminates.

Referring to FIG. 10, an interrupt service routine (ISR) 190 may be thought of as a breakpoint ISR 190. Accordingly, a test 192 determines whether the debug register 6 has bit BD set. If so, then debug register access 194 occurs. Otherwise, a test 196 determines whether the debug register 6 has bit B3 set. If so, then an FDC command 198 occurs. Otherwise, then the invocation 199 follows, for invoking 200 the original interrupt service routine.

Referring to FIG. 11, the details of the debug routine access 194 begin with obtaining 202 a next instruction to be executed by the processor. The address for the instruction is located in the CS:EIP register pair.

Thereafter, a test 204 determines whether the next instruction contains a first byte value designated by the test 204. For example, the testing value may be 0×0F. This value corresponds to 0000 1111 in binary. If the test 204 is negative, then invocation 199 occurs. Otherwise, the test 206 determines whether or not the second byte has a test value. In one embodiment, the test value is 0×23. This corresponds to a binary value of 0010 0011, which indicated an attempt to write to one of the debug registers.

Again, if a test 206 results in a negative response, then invocation 199 is appropriate. Otherwise, a test 208 directed to the third byte ended with 0×38 determines whether the value is 0×18. This process effectively takes the form of 11 ee errr indicating that debug register 3 is the target register. If the response to the test 208 is positive, then the incrementing step 210 follows. The incrementing step 210 increments past the next instruction, thus, repelling an attempt to modify DR3 (unweld). The value of the register EIP plus 3 is loaded into the register EIP because the instruction is three bytes long.

If the results of the test 208 are negative, then a test 212 determines whether or not the third byte ended with 0×38 has a value of 0×38. If not, then the invocation 199 occurs again. However, a positive result to the test 212 means that a debug register 7 (DR7) is the target register. Thereafter, the incrementing step 210 proceeds as described above. Following the incrementing step 210, a return 214 from the interrupt returns the processing to its previous state.

Figure 12:
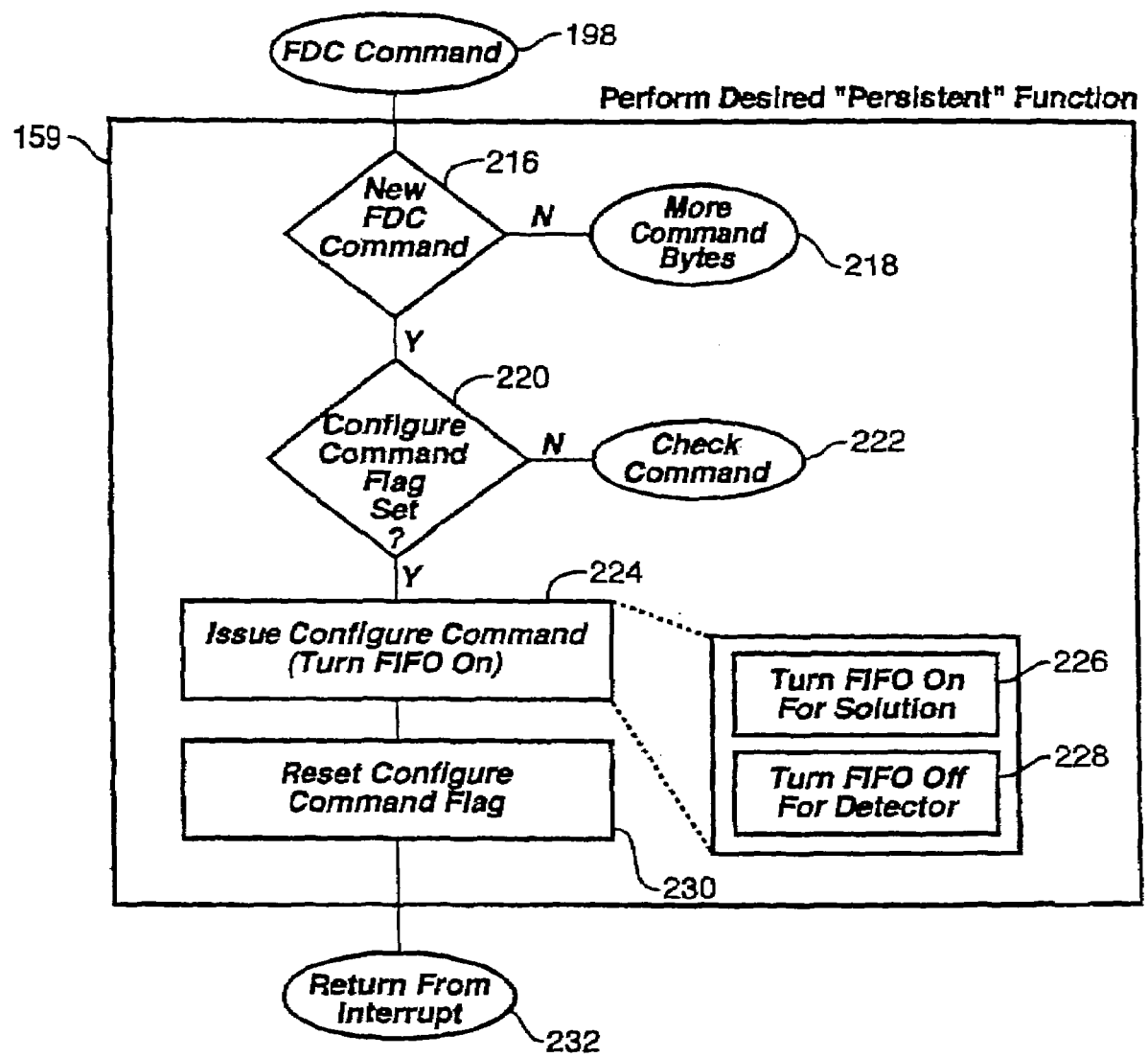
FIG. 12 is a schematic block diagram of a method for performing a desired persistent function in accordance with the invention.

Referring to FIG. 12, an FDC command 198 proceeds with a test to determine whether this is a new FDC command. If not, then more command bytes 218 may follow. Otherwise, a positive response engages another test 220 determining whether a configure command flag is set. If not, then an analysis of the command 222 follows.

Otherwise, a positive response leads to an issuing step 224 to issue a configure command. This configure command turns on or enables the FIFO. The issuing step 224 may include turning 226 or activating 226 the FIFO to a state of "on" if the solution process is the subject of interest. If, on the other hand, detection of the presence of the error solved by the invention is the issue, then the FIFO may be turned off 228. Turning the FIFO off 228 is important for providing the timing required in order to properly detect the presence of the design flaw in the hardware.

Thereafter, a resetting step 230 resets the configure command flag, after which a return 232 returns control of the system from the interrupt.

Referring to FIG. 14, a check command step 222, may begin with a test 234 to determine whether the command flag is set to configure. If not, a return 232 may return control from the interrupt. If, on the other hand, the test 234 returns a positive result, then setting 236 the configure command flag may precede a return 232 from the interrupt. Referring to FIG. 14, if more command bytes 218 are indicated as a result of the test 216 of FIG. 12, then a return 232 from the interrupt occurs directly.

Referring to FIG. 15, unloading 238 a driver, begins by restoring 240 the original interrupt service routine (ISR). Then, the values are restored 242 into the debug register 3 (DR3), the debug register 7 (DR7) returning these registers to their original state. Thereafter, restoring the original values to the control register 4 (CR4) completes the restoration of the state of the machine. Accordingly, a return 246 can follow immediately.

The invention described heretofore provides a detection solution that may be completely implemented in software as a device driver 29b that is capable of detecting defective FDCs 20 without visual inspection and identification of the FDCs. Furthermore, the unique and innovative approach taken, allows the implementation of the invention to accurately and correctly detect defective FDCs even when non-defective old-model FDCs are involved. Simply stated, it is not sufficient to determine whether the FDC under test is an old or new model FDC. Various vendors manufactured old-model FDCs that are not defective. Therefore, a two-phase detection process may correctly determine whether or not the FDC under test is defective.

The number of FDCs installed in computer systems today is well over 100 million. In order to identify defective FDCs, vendors and consumers that have defective FDCs 20 installed have very few alternatives (e.g. recalls; replacement), of which most are extremely costly, for determining whether or not their systems are susceptible to the data corruption presented by defective FDCs 20. Therefore, an apparatus and method that may be implemented as a software-only solution to this problem is a significant advance in the computer industry. Moreover, the robust design allows the apparatus and method of the present invention to address processor speeds that encompass the original IBM Personal Computers executing at 4.77 MHZ to the latest workstations that execute at well over 1 GHZ.

The function of transfer of data to devices controlled by the FDC is described above in one embodiment as occurring through direct memory access (DMA). Nevertheless, this function may be accomplished with any suitable memory controller or other manner of data transfer. For example, one manner disclosed above involving a memory controller other than a DMA includes programmed input and output (I/O) accomplished directly by the microprocessor. Thus, in this instance, one skilled in the art will understand that in the discussion above, where a DMA is used, programmed I/O or other types of memory controllers may be readily substituted.

A further aspect of the present invention involves specific implementations of a method for detecting and preventing floppy diskette controller data transfer errors in computer systems. One embodiment of the method has been included by incorporating by reference U.S. Pat. No. 5,379,414 issued to Phiflip M. Adams on Jan. 3, 1995. Another embodiment of the method has been included by incorporating by reference U.S. Pat. No. 5,983,002

One such specific implementation involves substituting a magnetic tape back-up device or an optical device, or other such peripheral, non-volatile memory device for the floppy drive previously described in the specific embodiment of the method. In so doing, the method substantially as disclosed is employed, substituting the use of the alternate peripheral, non-volatile memory device for the floppy drive. Appropriate commands are also substituted, as would be readily apparent to one skilled in the pertinent art.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed and desired to be secured by United States Letters Patent is:

1. An apparatus comprising:
   a defective I/O controller comprising a data buffer having at least one storage element, the defective I/O controller being configured to allow a write operation to the data buffer and a read operation from the data buffer, the read operation reading the data buffer in an attempt to read data not yet written to the data buffer by the write operation;
   a computer-readable medium storing a function module to correct the defective I/O controller by assuring that the write operation has completed prior to allowing the read operation; and
   a welding module to inseparably connect the function module to the defective I/O controller.

2. The apparatus of claim 1, wherein the function module is implemented by at least one of hardware, software, firmware, and combinations thereof.

3. The apparatus of claim 2, wherein the data buffer is a FIFO.

4. The apparatus of claim 3, wherein the defective I/O controller is a floppy diskette controller.

5. The apparatus of claim 4, further comprising a defense module to resist attempts by software to unweld the function module from the defective I/O controller.

6. The apparatus of claim 1, wherein the data buffer is a FIFO.

7. The apparatus of claim 1, wherein the defective I/O controller is a floppy diskette controller.

8. The apparatus of claim 1, further comprising a defense module to resist attempts by software to unweld the function module from the defective I/O controller.

9. An apparatus comprising:
   a defective I/O controller comprising a data buffer having at least one storage element, the defective I/O controller being configured to allow a read operation from the data buffer and a write operation to the data buffer, the write operation writing over data read by the read operation;

a computer-readable medium storing a function module to correct the defective I/O controller by assuring that the read operation has completed prior to allowing the write operation; and a welding module to inseparably connect the function module to the defective I/O controller.

10. The apparatus of claim 9, wherein the function module is implemented by at least one of hardware, software, firmware, and combinations thereof.

11. The apparatus of claim 10, wherein the data buffer is a FIFO.

12. The apparatus of claim 11, wherein the defective I/O controller is a floppy diskette controller.

13. The apparatus of claim 12, further comprising a defense module to resist attempts by software to unweld the function module from the defective I/O controller.

14. The apparatus of claim 9, wherein the data buffer is a FIFO.

15. The apparatus of claim 9, wherein the defective I/O controller is a floppy diskette controller.

16. The apparatus of claim 9, further comprising a defense module to resist attempts by software to unweld the function module from the defective I/O controller.

* * * * *